United States Patent
Chung

(10) Patent No.: US 9,334,837 B2
(45) Date of Patent: May 10, 2016

(54) MICROCONDENSER DEVICE AND EVAPORATIVE EMISSION CONTROL SYSTEM AND METHOD HAVING MICROCONDENSER DEVICE

(75) Inventor: Dennis B. Chung, Dublin, OH (US)

(73) Assignee: Honda Motor Co., Ltd., Tokyo (JP)

( * ) Notice: Subject to any disclaimer, the term of this patent is extended or adjusted under 35 U.S.C. 154(b) by 731 days.

(21) Appl. No.: 13/702,796

(22) PCT Filed: Jun. 8, 2011

(86) PCT No.: PCT/US2011/039563
§ 371 (c)(1),
(2), (4) Date: Jan. 29, 2013

(87) PCT Pub. No.: WO2011/156452
PCT Pub. Date: Dec. 15, 2011

(65) Prior Publication Data
US 2013/0118457 A1    May 16, 2013

Related U.S. Application Data

(63) Continuation-in-part of application No. 12/797,257, filed on Jun. 9, 2010, now abandoned.

(51) Int. Cl.
*F02M 33/02* (2006.01)
*B01D 53/00* (2006.01)
(Continued)

(52) U.S. Cl.
CPC .............. *F02M 33/02* (2013.01); *B01D 53/002* (2013.01); *F02M 25/0854* (2013.01);
(Continued)

(58) Field of Classification Search
CPC ................... F02M 2025/0863; F02M 25/089;
F02M 31/20; F02M 33/04; F02M 33/08;
F02M 2700/4359; F02M 25/0854; F02M
2025/0881; F28F 21/02; F25J 1/023; F25J
1/0022; F25J 1/0025
See application file for complete search history.

(56) References Cited

U.S. PATENT DOCUMENTS 4,316,774 A    2/1982    Trusch
4,459,428 A    7/1984    Chou
(Continued)

FOREIGN PATENT DOCUMENTS

DE    10125141    12/2002
DE    20312909    11/2003
(Continued)

OTHER PUBLICATIONS

International Search Report and Written Opinion of PCT/US2011/039563 dated Nov. 9, 2011.
(Continued)

*Primary Examiner* — Erick Solis
*Assistant Examiner* — Anthony L Bacon
(74) *Attorney, Agent, or Firm* — Rankin, Hill & Clark LLP

(57) ABSTRACT

A microcondenser device for an evaporative emission control system includes a housing having an inlet for receiving fuel vapor and a condensation outlet for discharging condensed fuel vapor, and a porous element disposed in the housing and fluidly interposed between the inlet and the condensation outlet for absorbing the fuel vapor received through the inlet. The microcondenser device further includes a thermoelectric element in thermal contact with the porous element for removing heat from the fuel vapor absorbed by the porous element to condense the fuel vapor.

25 Claims, 14 Drawing Sheets

(51) Int. Cl.
*F02M 25/08* (2006.01)
*F02M 31/20* (2006.01)
*H01L 35/00* (2006.01)
*B01D 53/04* (2006.01)

(52) U.S. Cl.
CPC .............. *F02M 31/20* (2013.01); *H01L 35/00* (2013.01); *B01D 53/0407* (2013.01); *B01D 2259/4516* (2013.01); *F02M 2025/0863* (2013.01); *Y02T 10/126* (2013.01); *Y02T 10/166* (2013.01)

(56) References Cited

U.S. PATENT DOCUMENTS

| | | | |
|---|---|---|---|
| 4,732,588 A * | 3/1988 | Covert | F02M 25/0854 123/519 |
| 4,873,835 A | 10/1989 | Rojey et al. | |
| 5,255,735 A | 10/1993 | Raghava et al. | |
| 5,300,197 A | 4/1994 | Mitani et al. | |
| 5,322,116 A | 6/1994 | Galloway et al. | |
| 5,355,861 A | 10/1994 | Arai | |
| 5,634,342 A | 6/1997 | Peeters et al. | |
| 5,636,668 A | 6/1997 | Thompson | |
| 5,827,424 A | 10/1998 | Gillis et al. | |
| 5,931,141 A | 8/1999 | Chino | |
| 5,957,113 A | 9/1999 | Masaki et al. | |
| 5,964,204 A | 10/1999 | Freeland | |
| 6,018,459 A * | 1/2000 | Carlson | F28F 13/003 165/80.3 |
| 6,098,601 A | 8/2000 | Reddy | |
| 6,141,969 A | 11/2000 | Launchbury et al. | |
| 6,148,635 A | 11/2000 | Beebe et al. | |
| 6,176,259 B1 | 1/2001 | Harde et al. | |
| 6,294,721 B1 | 9/2001 | Oravetz et al. | |
| 6,397,936 B1 | 6/2002 | Crowley et al. | |
| 6,427,449 B1 | 8/2002 | Logan et al. | |
| 6,432,696 B2 | 8/2002 | Custance et al. | |
| 6,439,277 B1 | 8/2002 | Kyburz | |
| 6,539,728 B2 | 4/2003 | Korin | |
| 6,569,228 B2 | 5/2003 | Ito | |
| 6,574,979 B2 | 6/2003 | Faqih | |
| 6,698,502 B1 * | 3/2004 | Lee | F28D 15/0266 165/104.26 |
| 6,772,603 B2 | 8/2004 | Hsu et al. | |
| 6,786,207 B2 | 9/2004 | Kojima et al. | |
| 6,957,542 B1 | 10/2005 | Kido et al. | |
| 7,527,045 B2 | 5/2009 | Chung | |
| 7,546,460 B2 * | 6/2009 | Maes | H04L 12/58 713/150 |
| 7,682,009 B1 | 3/2010 | Sliwa et al. | |
| 7,713,421 B2 | 5/2010 | Galbraith | |
| 7,827,972 B2 | 11/2010 | Makino | |
| 2002/0108604 A1 | 8/2002 | Distelhoff et al. | |
| 2003/0068254 A1 | 4/2003 | Bruck et al. | |
| 2005/0072165 A1 | 4/2005 | Bell | |
| 2005/0088823 A1 * | 4/2005 | Kabadi | C04B 38/0067 361/704 |
| 2005/0109327 A1 | 5/2005 | Reddy | |
| 2005/0144968 A1 | 7/2005 | Shakespeare | |
| 2005/0262720 A1 | 12/2005 | Rane et al. | |
| 2006/0036106 A1 | 2/2006 | Mazanec | |
| 2006/0092641 A1 | 5/2006 | Phelan et al. | |
| 2006/0196968 A1 | 9/2006 | Rabin | |
| 2007/0137246 A1 | 6/2007 | McKellar et al. | |
| 2007/0151275 A1 | 7/2007 | Chiriac | |
| 2007/0202391 A1 | 8/2007 | Greiner | |
| 2007/0263374 A1 | 11/2007 | Luettgen et al. | |
| 2007/0288193 A1 | 12/2007 | Lima | |
| 2008/0283127 A1 * | 11/2008 | Wang | B60K 15/03519 137/313 |
| 2009/0008066 A1 * | 1/2009 | Meng | F04D 29/582 165/104.33 |
| 2009/0031996 A1 | 2/2009 | Chung | |
| 2009/0031997 A1 | 2/2009 | Makino | |
| 2009/0093065 A1 | 4/2009 | Ding et al. | |
| 2009/0157277 A1 * | 6/2009 | Pursifull | F02B 43/10 701/102 |
| 2009/0194076 A1 | 8/2009 | Elwart et al. | |
| 2009/0288645 A1 * | 11/2009 | Childress | F02M 25/089 123/520 |
| 2010/0160181 A1 | 6/2010 | Sliwa, Jr. et al. | |
| 2010/0218512 A1 | 9/2010 | Alahyari et al. | |
| 2010/0328888 A1 | 12/2010 | Campbell et al. | |
| 2011/0011264 A1 | 1/2011 | Makino et al. | |
| 2013/0143272 A1 * | 6/2013 | Guo | B01L 7/52 435/91.2 |

FOREIGN PATENT DOCUMENTS

| | | |
|---|---|---|
| GB | 1276534 | 6/1972 |
| JP | 6173787 | 6/1994 |
| JP | 2003314384 | 11/2003 |

OTHER PUBLICATIONS

Supplementary European Search Report of EP11793072 dated Nov. 13, 2013.

Office Action of U.S. Appl. No. 12/797,257 dated May 20, 2014, 43 pages.

* cited by examiner

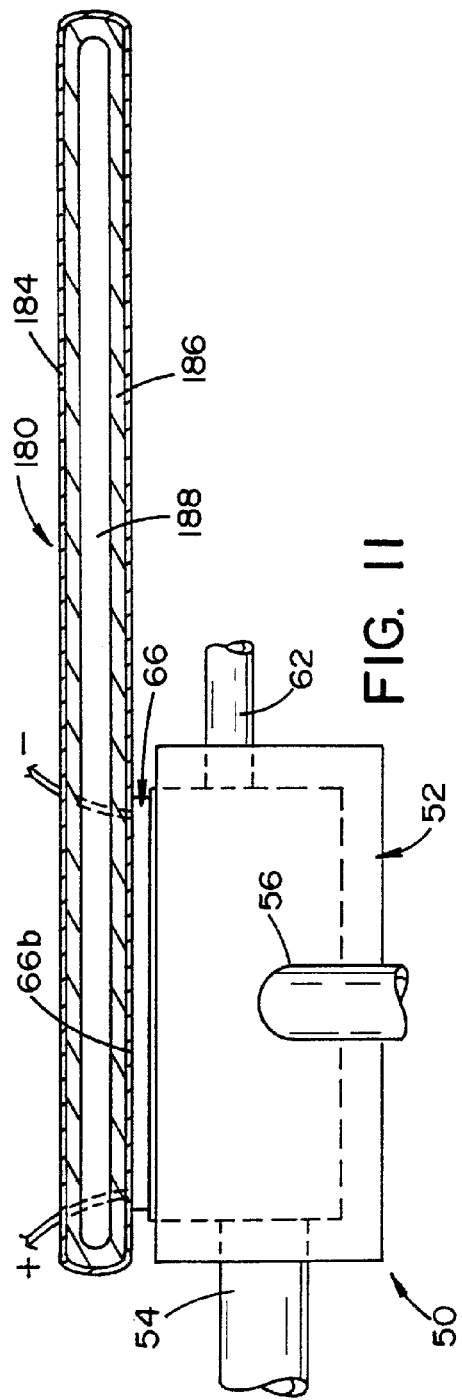
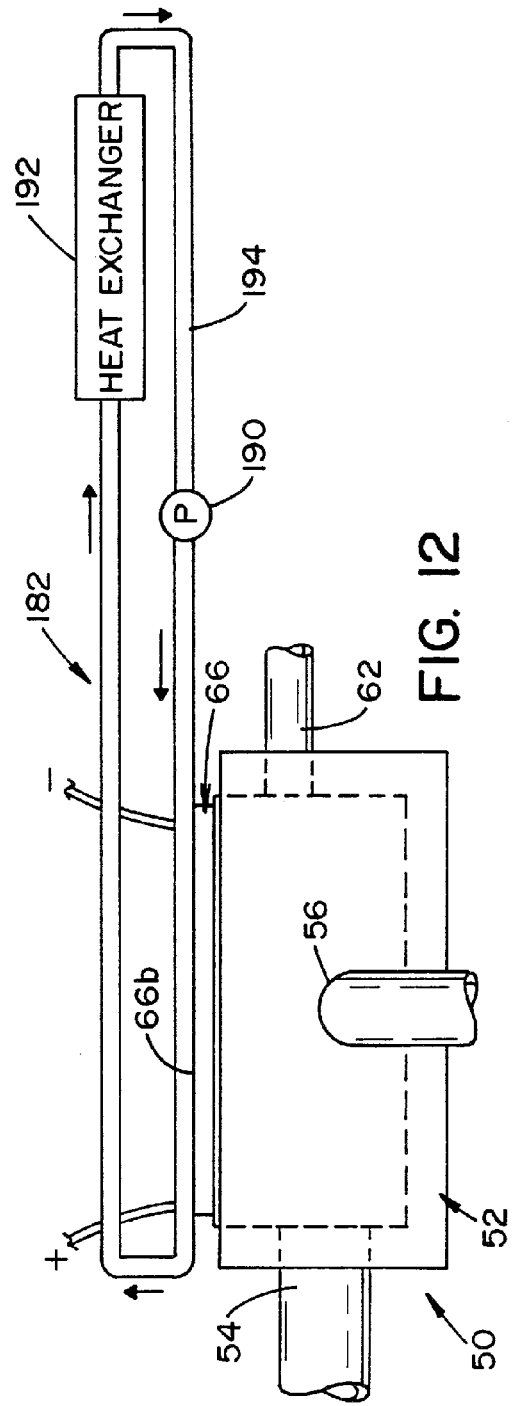

MICROCONDENSER DEVICE AND EVAPORATIVE EMISSION CONTROL SYSTEM AND METHOD HAVING MICROCONDENSER DEVICE

BACKGROUND

The present disclosure generally relates to evaporative emission control systems (e.g., for internal combustion engines), and more particularly relates to a microcondenser device for evaporative emission control and evaporative emission control systems and methods incorporating microcondenser devices.

Conventional vehicle fuel systems associated with internal combustion engines typically employ a fuel canister for receiving fuel vapor from a vehicle's fuel tank. The fuel canister is adapted to temporarily retain the received vapor therein to prevent it from being released to the atmosphere. More particularly, fuel vapor can enter the fuel canister from the fuel tank wherein the fuel vapor is absorbed and retained in a carbon bed of the fuel canister. Typically, the retention of the displaced fuel vapor within the fuel canister is only temporary as the fuel vapor retained in the fuel canister is periodically purged to allow the canister to accommodate and absorb additional fuel vapor from the fuel tank. During such purging, the fuel vapor captured by the canister can be sent to the vehicle's engine, and particularly to an induction system of the engine, for combustion.

Various other systems have been proposed to more strictly control containment of fuel vapors and/or improve vehicle efficiency by controlling fuel vapor processing. Some of these systems can be used in environments beyond that of a vehicle (e.g., underground fuel storage vessels). For example, some systems include a bladder disposed in a vehicle's fuel tank that expands and contracts to control fuel vapor. A pump can be used in association with the bladder for applying pressure to the walls of the bladder. The pressure is applied for purposes of forcing the bladder walls against the fuel contained therein to prevent or limit vapor formation. A fuel canister, as described in the preceding paragraph, can optionally be used in the bladder fuel system for capturing fuel vapor that forms despite the use of the bladder.

Also known is a canisterless evaporative emission control system for an internal combustion engine. One particular known system includes a fuel tank wherein vaporized fuel is generated and a microcondenser device for processing the vaporized fuel received from the fuel tank. The microcondenser device has a heat sink portion formed of carbon foam in thermal communication with a thermoelectric element for removing heat from the heat sink portion. The fuel vapor is processed by passing the fuel vapor through the heat sink portion to remove heat therefrom and condense at least a portion of the fuel vapor to liquid fuel. Drawbacks of this known canisterless control system include significant power consumption requirements for the thermoelectric element and a significant volume of uncondensed fuel vapor passing through the microcondenser device.

SUMMARY

According to one aspect, a microcondenser device for an evaporative emission control system includes a housing having an inlet for receiving fuel vapor and a condensation outlet for discharging condensed fuel vapor, and a porous element disposed in the housing and fluidly interposed between the inlet and the condensation outlet for absorbing the fuel vapor received through the inlet. The microcondenser device further includes a thermoelectric element in thermal contact with the porous element for removing heat from the fuel vapor absorbed by the porous element to condense the fuel vapor.

According to another aspect, a microcondenser device for an evaporative emission control system includes a housing having a fuel vapor inlet and a condensed fuel vapor outlet and a porous element positioned in the housing for receiving the fuel vapor from said inlet. The porous element has at least one chamber therein. The microcondenser device further includes a heat transfer element in thermal communication with the porous element to remove heat from the fuel vapor to condense at least a portion of the fuel vapor.

According to still another aspect, a microcondenser device for an evaporative emission control system includes a housing having an inlet for receiving fuel vapor and an outlet for discharging condensed fuel vapor, a first porous element positioned in the housing between the inlet and the outlet, a second porous element positioned in the housing between the first element and the outlet to define a chamber between said first and second porous elements, and a heat transfer element in thermal communication with at least one of the porous elements to remove heat from the fuel vapor to condense at least a portion of the fuel vapor.

According to yet another aspect, an evaporative emission control system includes a fuel storage vessel wherein vaporized fuel is generated and a microcondenser device for processing the vaporized fuel received from the fuel storage vessel. The microcondenser device including a porous portion that facilitates removal of heat from the vaporized fuel.

According to a further aspect, an evaporative emission control method includes directing fuel vapor from a fuel storage vessel to a microcondenser device, condensing the fuel vapor in the microcondenser device, and returning condensed fuel vapor from the microcondenser device to the fuel storage vessel. The fuel storage vessel can be a fuel tank on a vehicle or some other type of fuel storage vessel, such as an underground fuel storage tank.

BRIEF DESCRIPTION OF THE DRAWINGS

FIG. 11 is a schematic elevational view of a microcondenser device having a heat pipe (shown in cross-section) for removing heat therefrom.

FIG. 12 is a schematic elevational view of a microcondenser device having a cooling fluid circuit for removing heat therefrom.

DETAILED DESCRIPTION

Figure 1:
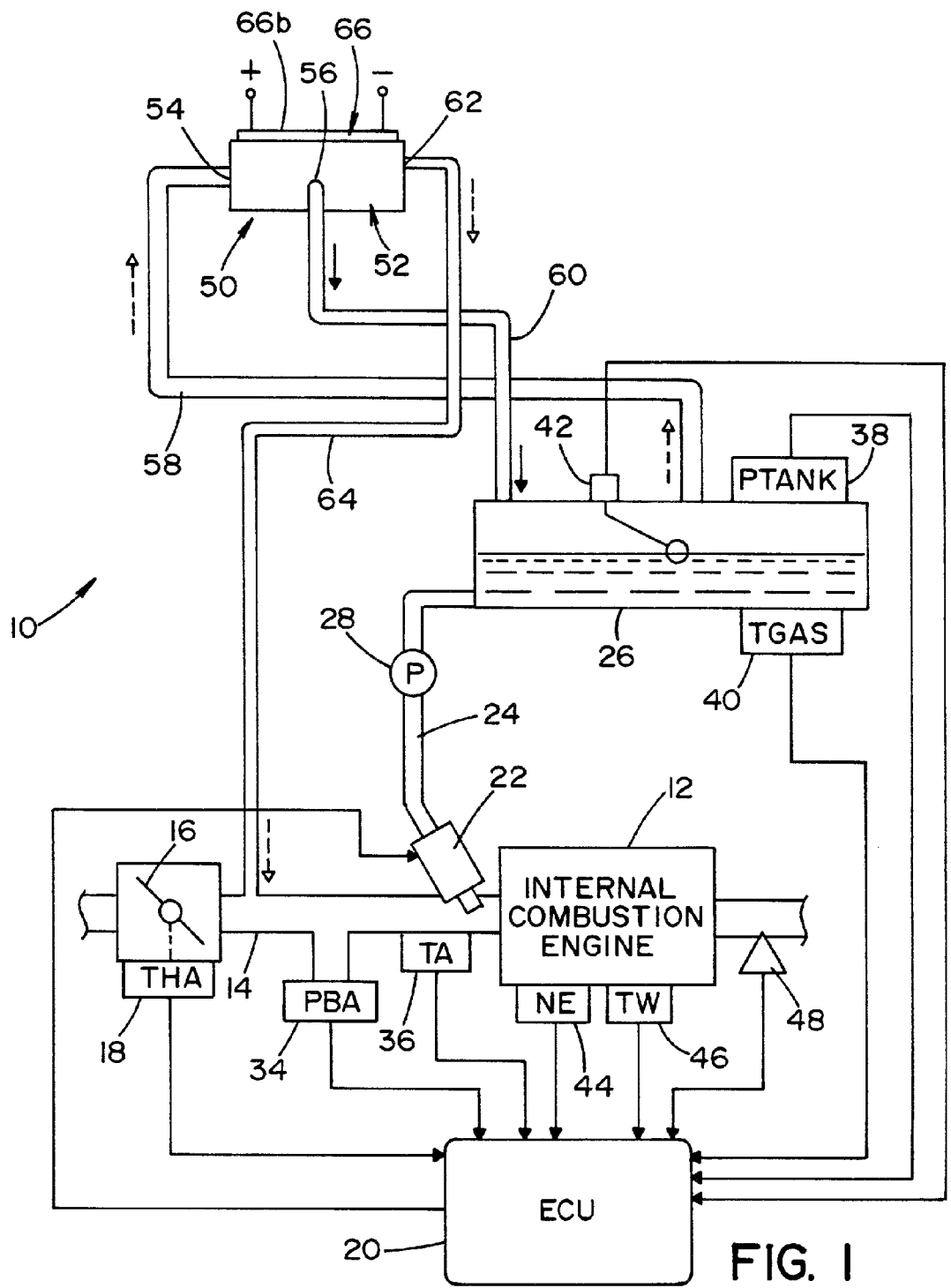
FIG. 1 is a schematic view of an evaporative emission control system having a microcondenser device for processing fuel vapor.

Referring now to the drawings wherein the showings are for purposes of illustrating one or more exemplary embodiments and not for purposes of limiting same, FIG. 1 schematically shows an evaporative emission control system 10 for an internal combustion engine 12. As shown, the engine 12 is provided with an induction system including an intake pipe 14 in which a throttle valve 16 is operatively mounted. A throttle valve opening (THA) sensor 18 is connected to the throttle valve 16. The throttle valve opening sensor 18 outputs a signal corresponding to the opening angle (THA) of the throttle valve 16 and supplies the signal to an electronic control unit (ECU) 20. Fuel injection valve 22, only one of which is shown, are inserted into the intake pipe 14 at locations intermediate between the cylinder block of the engine 12 and the throttle valve 16 and slightly upstream of the respective intake valves (not shown). The fuel injection valves 22 can be connected through a fuel supply pipe 24 to a fuel tank 26 and a fuel pump unit 28 is provided therealong for delivering fuel from the tank 26 to the fuel injection valves 22. Each fuel injection valve 22 can be electrically connected to the ECU 20, and its valve opening can be controlled by a signal from the ECU 20.

One or more sensors can be provided on the intake pipe 14 for monitoring conditions at the intake pipe 14. For example, the intake pipe 14 can be provided with an intake pipe absolute pressure (PBA) sensor 34 for detecting an absolute pressure (PBA) in the intake pipe 14 and an intake air temperature (TA) sensor 36 for detecting an air temperature (TA) in the intake pipe 14 at positions downstream of the throttle valve 16. These sensors, including sensors 34, 36, can each output a signal corresponding to a sensed condition (e.g., PBA or TA) and supply the outputted signal to the ECU 20. In addition, the fuel tank 26 can be provided with one or more sensors for monitoring specific conditions associated therewith, including, for example, a tank pressure (PTANK) sensor 38 for detecting a pressure (PTANK) in the fuel tank 26, a fuel temperature (TGAS) sensor 40 for detecting a fuel temperature (TGAS) in the fuel tank 26, and a fuel level sensor 42 for detecting a fuel level (i.e., a remaining fuel amount) in the fuel tank 26. Like the other sensors described herein, the fuel tank sensors, including sensors 38, 40, 42, can each output a signal corresponding to a sensed condition at the fuel tank 26 and provide the signal to the ECU 20.

Additional sensors can be provided on or in association with the engine 12. More particularly, an engine rotational (NE) sensor 44 for detecting an engine rotational speed (NE) can be disposed near the outer periphery of a camshaft or crankshaft (both not shown) of the engine 12. There can also be provided an engine coolant temperature sensor 46 for detecting a coolant temperature (TW) of the engine 12 and an oxygen concentration sensor (also referred to as a "LAF sensor") 48 for detecting an oxygen concentration in exhaust gases from the engine 12. Detection signals from these sensors 44, 46, 48 can be supplied to the ECU 20. The LAF sensor 48 can function as a wide-area air-fuel ratio sensor adapted to output a signal substantially proportional to an oxygen concentration and exhaust gases (i.e., proportional to an air-fuel ratio of air-fuel mixture supplied to the engine 12).

The evaporative emission control system 10 further includes a microcondenser device 50. With additional reference to FIG. 2, the microcondenser device 50 includes a housing 52 having an inlet 54 for receiving fuel vapor and a condensation outlet 56 for discharging condensed fuel vapor. In the illustrated embodiment, the inlet 54 is connected to the fuel tank 26 through vapor line 58 so that fuel vapors formed in the fuel tank 26 can be delivered to the microcondenser device 50. The condensation outlet 56 is also connected to the fuel tank 26. In particular, the condensation outlet 56 is connected to the fuel tank 26 through condensation discharge line 60 for directing condensed vapor (i.e., liquid fuel) from the microcondenser device 50 back to the fuel tank 26. The housing 52 can also have a vapor outlet 62 for discharging fuel vapor that remains vaporized after passing through the microcondenser device 50. In the illustrated embodiment, the vapor outlet 62 is fluidly connected to the intake pipe 14 upstream of the fuel injection valves 22 via vapor line 64. This allows fuel vapor discharged by the microcondenser device 50 to be recirculated through the internal combustion engine 12 for combustion therein.

As will be described in more detail below, the microcondenser device 50 can also include a thermoelectric element 66 for condensing fuel vapors admitted through the inlet 54. The thermoelectric element 66 can be a Peltier microelement that employs or uses the Peltier effect to condense evaporative or vaporized fuel received from the fuel tank 26 via the vapor line 58. Advantageously, providing the thermoelectric element 66 as a Peltier microelement can be effective for condensing vaporized fuel from the fuel tank 26 while being of a small size and requiring minimum power consumption thereby not taxing the spatial layout of the vehicle or its electrical system. Operation of the microcondenser device 50 can occur as described in U.S. Pat. No. 7,527,045, which is expressly incorporated in its entirety herein.

Figure 2:
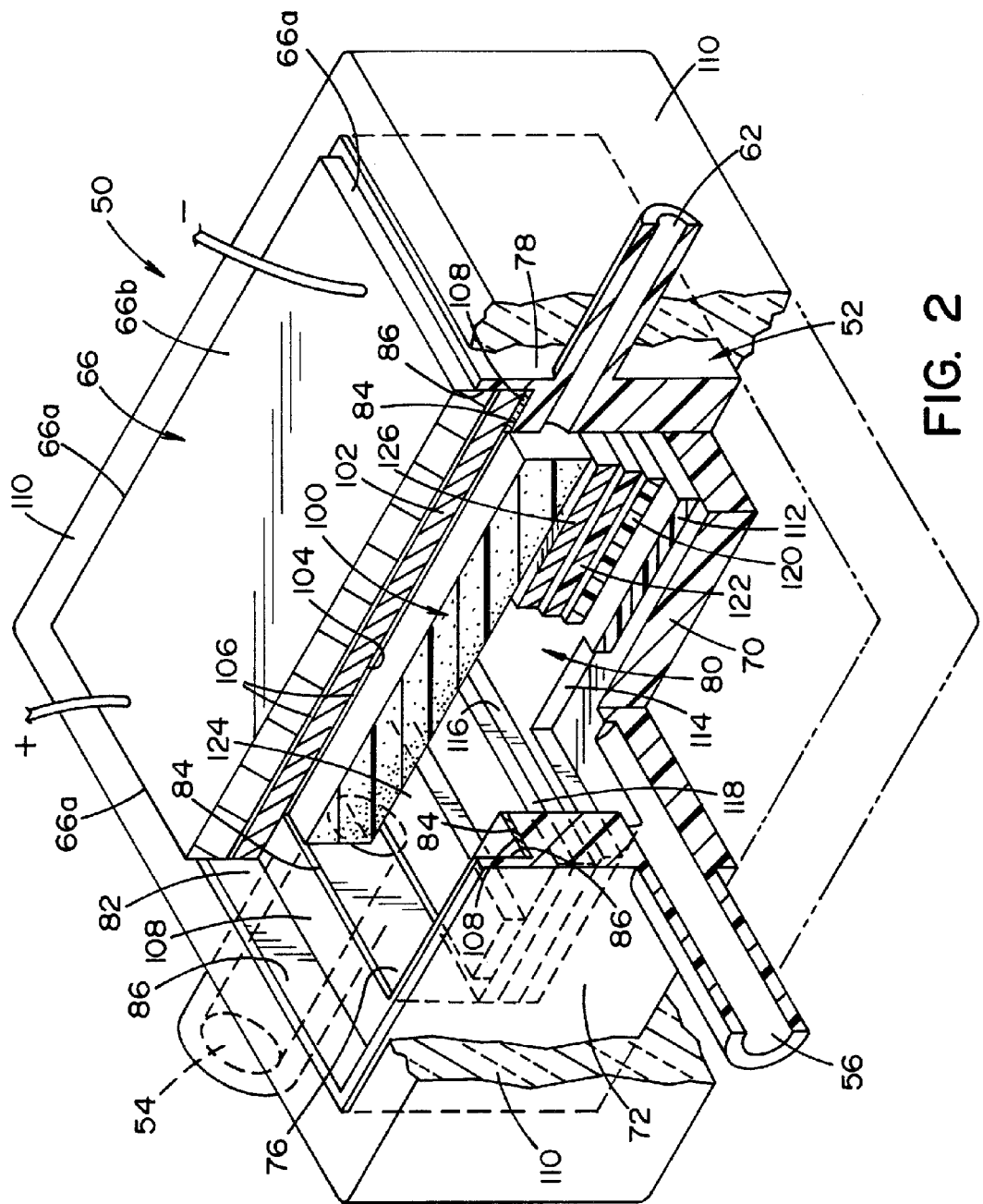
FIG. 2 is a perspective view, partially in cross-section, of the microcondenser device.
Figure 3:
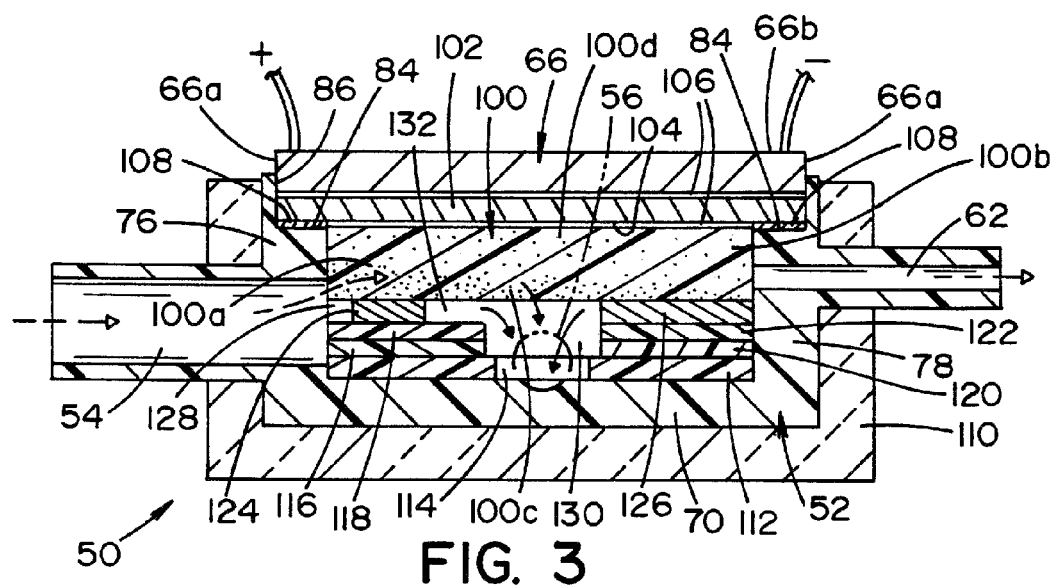
FIG. 3 is an elevational cross-section view of the microcondenser device.
Figure 4:
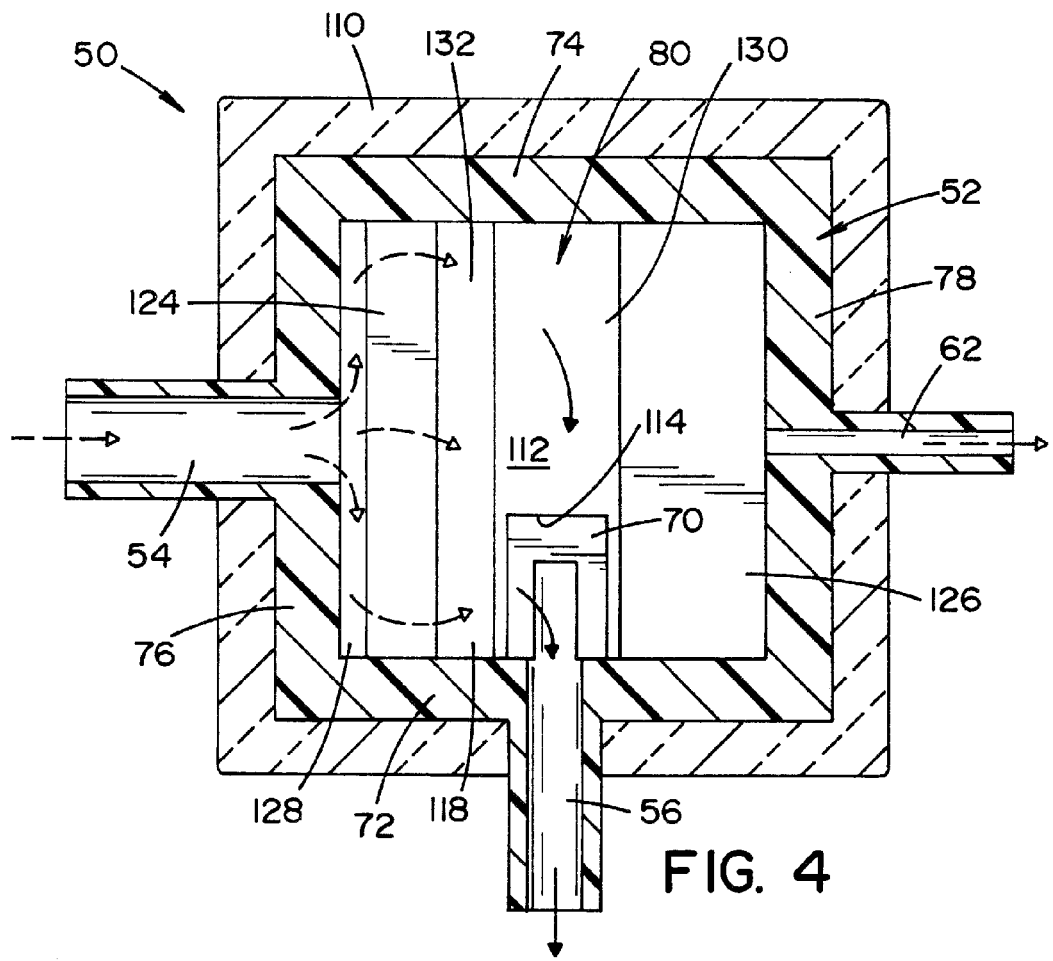
FIG. 4 is plan cross-section view of the microcondenser device.

With additional reference to FIGS. 3 and 4, the housing 52 has a bottom or lower wall 70 and at least one side wall 72, 74, 76, 78 extending upward from the lower wall 70. The lower wall 70 and the at least one side wall 72-78 together define a chamber 80 in the housing 52. In the embodiment illustrated in FIGS. 2-4, the housing 52 has a cuboid or box-shaped configuration such that the at least one side wall includes four rectangular side walls 72, 74, 76, 78, each extending orthogonally upward from the lower wall 70. As shown, the inlet 54 is defined in the housing 52, and particularly the side wall 76 thereof, for admitting fuel vapor into the chamber 80. The condensation outlet 56 is defined in the housing 52, and particularly in the side wall 72 thereof, for discharging liquid fuel that is condensed from the fuel vapor in the chamber 80. The vapor outlet 62 is defined in the housing 52, and particularly in the side wall 78 thereof, for discharging uncondensed fuel vapor from the chamber 80.

In a non-limiting example, the thermoelectric element 66 is supported by the at least one side wall (i.e., side walls 72-78 in the embodiment illustrated in FIGS. 2-4) in spaced relation relative to the lower wall 70. By this arrangement, the thermoelectric element 66 is spaced apart vertically from the bottom wall 70. For supporting the thermoelectric element 66 in spaced relation relative to the lower wall 70, the at least one side wall (i.e., side walls 72-78) can include a recess 82 defined by a shoulder 84 and face 86 extending upward from the shoulder 84. In particular, each of the side walls 72-78 of the illustrated embodiment can include shoulder 84 and face 86 defining the recess 82. As shown, the thermoelectric element 66 can be supported on the shoulder 84 and sized such that at least one peripheral edge of the thermoelectric element 66 is positioned closely adjacent the face 86. In the illustrated embodiment, the thermoelectric element 66 can have a rectangular configuration including four peripheral edges 66a and each peripheral edge 66a can be positioned closely adjacent face 86 of a corresponding one of the side walls 72-78. By this arrangement, the thermoelectric element 66 is nestably received within the recess 82 defined in the housing 52.

A porous element 100 can be disposed in the housing 52, and particularly received in the chamber 80 of the housing 52. The porous element is fluidly interposed between the inlet 54 and the condensation outlet 56 for absorbing or receiving the fuel vapor admitted through the inlet 54. The thermoelectric element 66 can be in thermal contact with the porous element 100 for removing heat from the fuel vapor absorbed or received by the porous element 100 to condense the fuel vapor. In particular, the porous element 100 can be in conductive thermal contact with the thermoelectric element 66. In addition to being interposed between the inlet 54 and the condensation outlet 56, the porous element 100 is also fluidly interposed between the inlet 54 and the vapor outlet 62, which discharges fuel vapor that remains vaporized after passing through the porous element 100.

In one embodiment, the porous element 100 is a carbon foam element. Being formed of carbon foam provides advantages such as higher thermal conductivity and greater surface area per unit volume than conventional heat sinks and/or heat sinks formed of fins (e.g., aluminum fins). Moreover, the carbon foam element 100 has greater heat transfer efficiency than conventional arrangements which results in the overall electric load needed to power the microcondenser device 50 being considerably lower than would be necessary if using conventional fins.

In the illustrated embodiment, a heat conductive plate 102 is interposed between the porous element 100 and the thermoelectric element 66. In one embodiment, the heat conductive plate 102 is a copper plate and may be referred to herein as a copper plate 102. Although referred to herein as copper plate 102, it is to be understood that the plate 102 may be any metal or metal alloy capable of conducting heat. Accordingly, conductive heat transfer occurs from the porous element 100, then to the copper plate 102, and next to the thermoelectric element 66. Using the copper plate 102 allows for improved heat transfer from the porous element 100 to the thermoelectric element 66. In particular, the copper plate 102 can have an improved flatness, particularly on a side 104 that interfaces with the porous element 100 (i.e., improved flatness compared to other efficient heat transfer materials). In addition, a thermal paste 106 can be interposed between at least one of the copper plate 102 and the thermoelectric element 66 or the copper plate 102 and the porous element 100. In the illustrated embodiment, as shown, thermal paste 106 is interposed between both the copper plates 102 and the thermoelectric element 66 and the copper plate 102 and the porous element 100. The thermal paste 106 facilitates better heat transfer between conductive elements of the microcondenser device 50.

As shown in the illustrated embodiment, the copper plate 102 is supported by the shoulder 84 and the thermoelectric element 66 is supported on top of the copper plate 102. Together, the thermoelectric element 66 and the copper plate 102 are nestably received within the recess 82 defined in the housing 52. Particularly, in the illustrated embodiment, these elements 66, 102 form an upper side of the housing 52 and close the chamber 80 defined by the housing 52. A seal 108 can be interposed between the underside 104 of the copper plate 102 and the shoulder 84 defined in each of the side walls 72-78. The nesting relation of the copper plate 102 and the thermoelectric element 66 within the recess 82 and/or the provision of the seal 108 is believed to advantageously reduce or eliminate frost or fog formation on the microcondenser device 50, and particularly the housing 52 thereof, which improves efficiency of the device 50 (i.e., less power is needed to operate the device).

Also to improve efficiency of the microcondenser device 50, the housing 52 can be formed of a plastic material. This provides the housing 52 with a low heat mass body and a low thermal conductivity body material. The particular plastic material employed for the housing 52 can have sufficient rigidity while otherwise reducing the amount of energy needed for the thermoelectric element 66 to cool vaporized fuel passing through the porous element 100. Using plastic also provides an additional minimal weight benefit through the use of a lighter material.

Specifically, for example, the body material of the housing 52 can be polyamide, polyacetal, PEI, PPS, or any other fuel-resistant plastic material providing for low heat loss and/or low thermal mass. In addition, to further limit thermal loss to the environment, an insulation or an insulating layer can be disposed around an exterior of the housing 52 or inside the housing around the porous element 100. In the illustrated embodiment, a foam insulating layer 110 is shown provided around an exterior of the housing 52. Alternatively, other insulating materials can be applied to the exterior of the housing 52. For example, aerogels or other foams can be applied to an exterior of the housing for insulating the housing from thermal losses to the surrounding environment.

The microcondenser device 50 can additionally include at least one support baffle supporting the porous element 100 within the housing 52. As will be described in more detail below, the at least one support baffle supports the porous element 100 in an elevated position (i.e., in spaced apart relation) from the lower wall 70 and in conductive thermal contact with the thermoelectric element 66. As will also be described in more detail below, the at least one support baffle can urge the porous element 100 toward the thermoelectric element 66 and/or into thermal contact with the thermoelectric element 66. The at least one support baffle can be one or more baffles shaped or configured to provide various subchambers within the chamber 80 of the housing 52. The baffles can be formed of a foam insulation material, such as a Teflon foam insulation, for example, which provides the baffles with some resiliency and enable the stacked baffles to urge the porous element 100 toward the copper plate 102, which assists in efficient heat transfer therebetween.

In the illustrated embodiment, the at least one support baffle includes a plurality of stacked baffles, which facilitates the baffles urging or supplying support pressure against the porous element 100. Whether stacked, shaped or otherwise configured, the one or more support baffles can be arranged to efficiently direct fuel vapor into the porous element 100 and/or to facilitate efficient liquid drainage (i.e., condensed fuel vapor). In the illustrated embodiment, the plurality of baffles includes a base baffle 112 having a cut out or recess 114 accommodating the condensation outlet 56. Intermediate baffles 116, 118, 120, 122 are stacked on the base baffle 112. In particular, intermediate baffles 116, 118 are together stacked and form a first pair of stacked baffles. Likewise, intermediate baffles 120, 122 are together stacked and form a second pair of stacked baffles. Thus, the baffles 116-122 are arranged in stacked pairs wherein the first pair of stacked baffles 116, 118 are together stacked adjacent the inlet 54 and the second pair of baffles 120, 122 are stacked adjacent the vapor outlet 62, and wherein the pairs of stacked baffles 116, 118 and 120, 122 flank the condensation outlet 56.

The baffles can be arranged so as to direct gas and/or liquid flow within the microcondenser device 50 and support the porous element 100. For example, upper baffles 124, 126 are disposed in stacked relation above the intermediate baffles 116-122 and can directly support the porous element 100. In particular, the illustrated embodiment, the upper baffle 124 is stacked on the first pair of intermediate baffles 116, 118 adjacent the vapor inlet 54 and the upper baffle 126 is stacked on the second pair of intermediate baffles 120, 122 adjacent the vapor outlet 62. Like the intermediate baffles 116-122, the upper baffles 124, 126 can be laterally spaced apart from one another to flank the condensation outlet 56.

In the illustrated embodiment of FIGS. 2-4, the baffles are arranged so as to define a plenum chamber 128 adjacent the vapor inlet 54 and extending from the side wall 72 to the side wall 74. The plenum chamber 128 can allow the fuel vapor admitted through the vapor inlet 54 to more evenly distribute along a dimension of the porous element 100 extending from the side wall 72 to the side wall 74 and thus more effectively absorb the fuel vapor. In particular, the plenum chamber 128 of the illustrated embodiment is formed by the side walls 72, 74, 76, the baffles 118 and 124, and the porous element 100. The plenum chamber 128 extends along substantially an entire width of the porous element 100 (e.g., the width extending between the side walls 72, 74). The plenum chamber 128 can function to ensure that fuel vapor entering through the inlet 54 is allowed to spread out before being absorbed into the porous element 100.

The baffles 116, 118, 120, 122, 124, and 126 also define a condensation chamber 130 vertically between the condensation outlet 56 and the porous element 100. As shown, the condensation chamber 130 is disposed below the porous element 100. This allows gravity to assist in removing condensed fuel from the porous element 100 and directing the same to the condensation outlet 56. The upper baffle 124 is smaller in the illustrated embodiment than the upper baffle 126, which defines an expanded area 132 of the condensation chamber 130. The expanded area 132 facilitates gravitational removal of condensed fuel from the porous element 100 on a side of the condensation chamber 130 adjacent the vapor inlet 54.

Figure 5:
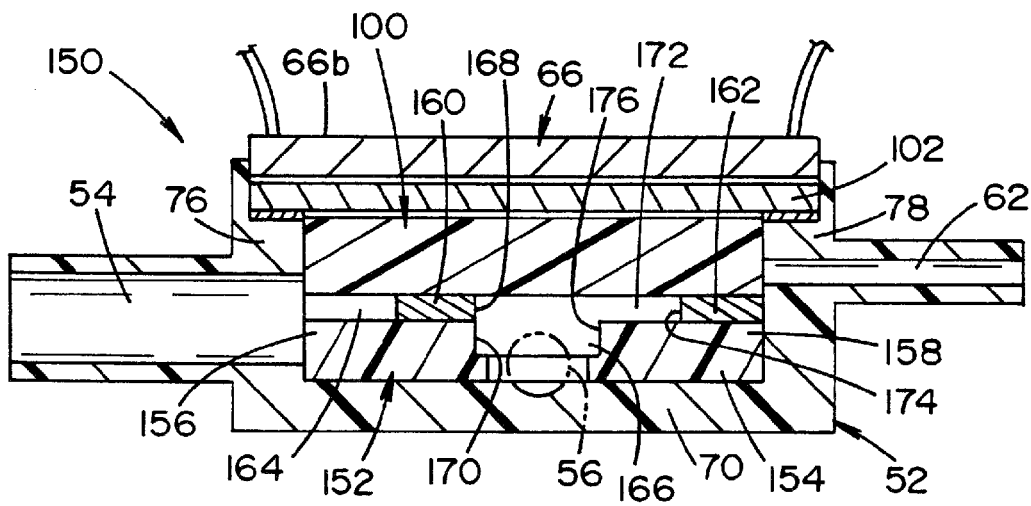
FIG. 5 is an elevational cross-section view of a microcondenser device according to an alternate embodiment.
Figure 6:
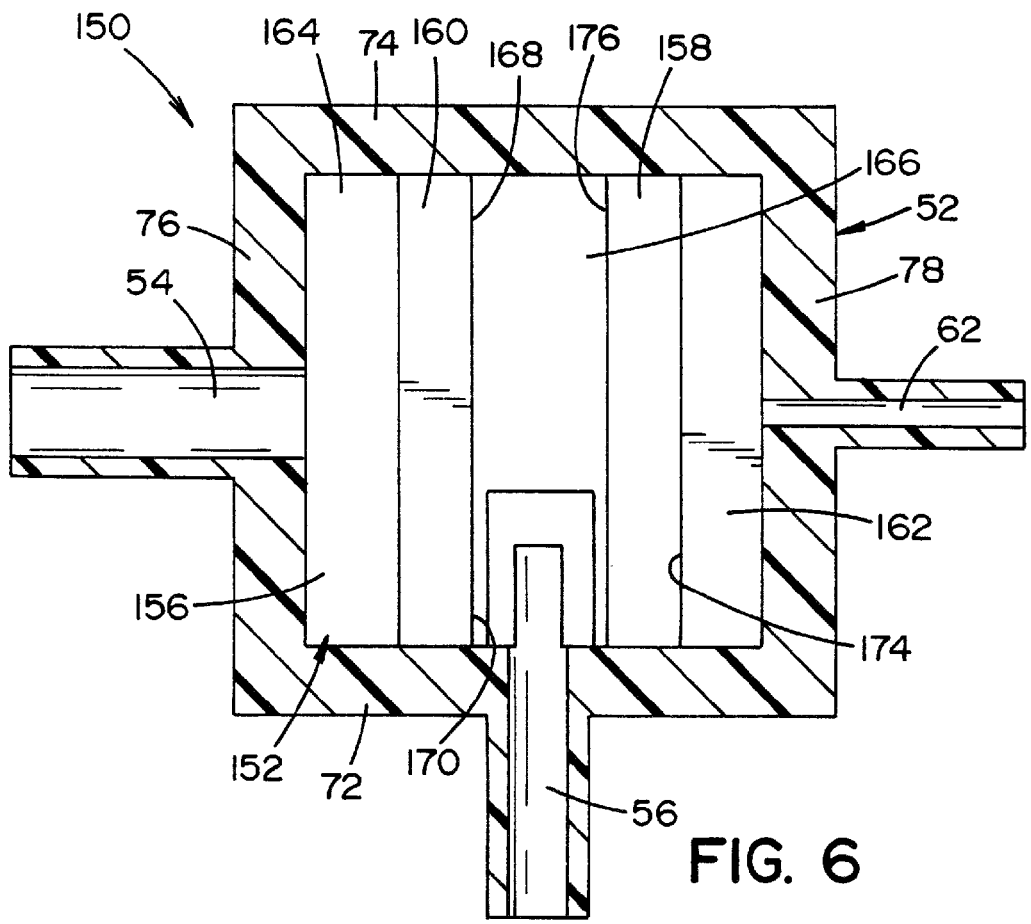
FIG. 6 is a plan cross-section view of the microcondenser device of FIG. 5.

With reference to FIGS. 5 and 6, a microcondenser device 150 is illustrated. The microcondenser device 150 can be the same as the microcondenser device 50 except as indicated below. In FIGS. 5 and 6, the base and intermediate stacked baffles of the microcondenser device 50 are replaced with a single shaped baffle 152 that includes a base portion 154 similar in configuration to the base baffle 112 and intermediate baffle portions 156, 158 that are similar in configuration to the stacked intermediate baffles 116-122. The microcondenser device 150 includes upper baffles 160, 162 disposed in stacked relation on the intermediate baffle portions 156, 158. Unlike the microcondenser device 50, the microcondenser 150 has its upper baffles 160, 162 sized and arranged to provide varying shapes for plenum chamber 164 and condensation chamber 166. In particular, the upper baffle 160 has a rear side 168 aligned with a rear side 170 of the intermediate baffle portion 156. Accordingly, no expanded area 132 is defined above the intermediate baffle portion 156; however, the plenum chamber 164 has an increased depth (i.e., a dimension from the vapor inlet 54 and/or side wall 76 to the upper baffle 160). Instead of the expanded area 132, an expanded area 172 is disposed above the intermediate baffle portion 158. The expanded area 172 results from the rear edge 174 of the upper baffle 162 being laterally spaced apart from the rear side 176 of the intermediate baffle portion 158.

Figure 7:
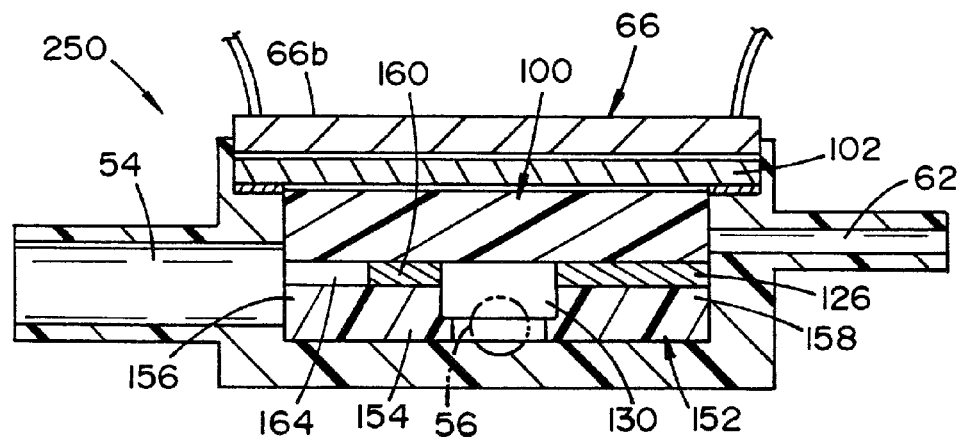
FIG. 7 is an elevational cross-section view of a microcondenser device according to another alternate embodiment.
Figure 8:
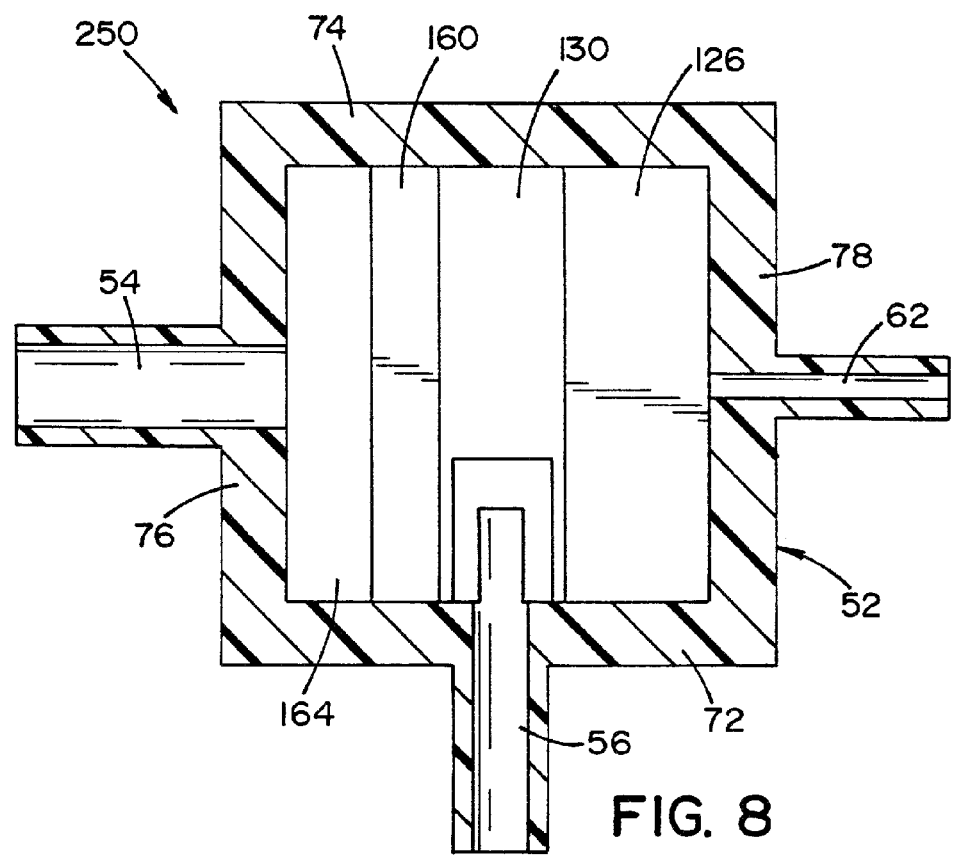
FIG. 8 is a plan cross-section view of the microcondenser device of FIG. 7.

With reference to FIGS. 7 and 8, another microcondenser device 250 is illustrated. The microcondenser device 250 can be the same as the microcondenser device 150 except as indicated below. In the embodiment illustrated in FIGS. 7 and 8, the upper baffle 162 is replaced with upper baffle 126 (i.e. the same baffle used in the microcondenser device 50). Accordingly, in this embodiment, there is no expanded area of the condensation chamber 130 above the intermediate baffle portion 156 or above the intermediate baffle portion 158, only the enlarged plenum chamber 164.

Figure 9:
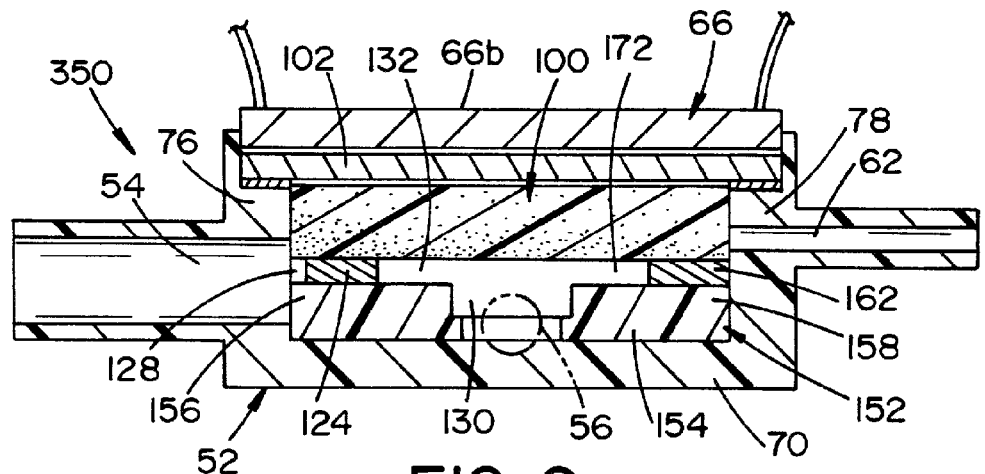
FIG. 9 is an elevational cross-section view of a microcondenser device according to yet another alternate embodiment.
Figure 10:
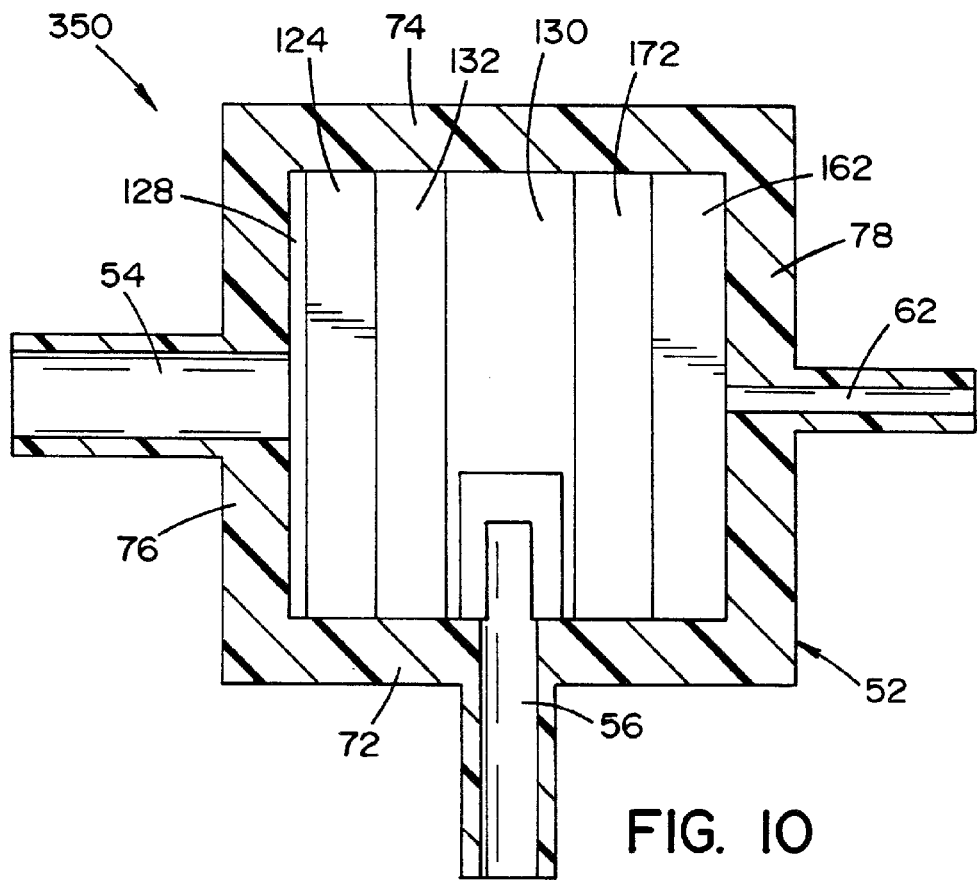
FIG. 10 is a plan cross-section view of the microcondenser device of FIG. 9.

With reference to FIGS. 9 and 10, still another microcondenser device 350 is illustrated, which can be the same as the microcondenser device 150 except as indicated below. In the microcondenser device 350, upper baffle 124 (same as used in the microcondenser 50) is disposed above the intermediate baffle portion 156 and the upper baffle portion 162 is disposed above the intermediate baffle portion 158. Accordingly, by this arrangement, expanded area 132 is disposed above the intermediate baffle portion 156 and expanded area 172 is disposed above the intermediate baffle portion 158. A small plenum chamber 128 is also disposed above the intermediate baffle portion 156 adjacent the inlet 54.

Returning reference to FIGS. 2-4, the porous element 100 can have a varying porosity. One non-limiting example of varying porosity for the porous element 100 is schematically illustrated by the stippling in the figures. As shown, the porous element 100 can have an increased porosity at a first side or portion 100a, which is adjacent the plenum chamber 128 and the inlet 54, than adjacent a second side or portion 100b. The porous element 100 can also have an increased porosity adjacent an underside or underside portion 100c than an upper side or upper side portion 100d that is adjacent the thermoelectric element 66. While the illustrated embodiment includes progressively decreasing porosity from the first side portion 100a to the second side portion 100b and from the underside portion 100c to the upper side portion 100d, it is to be appreciated that such varying porosity could occur only from one side to another (e.g., from side portion 100a to side portion 100b or from side portion 100c to side portion 100d). Alternatively, other arrangements or patterns of varying porosity could be used with the porous element 100.

As best shown in FIG. 3, the arrangement of the vapor inlet 54 and the outlets 56, 62 relative to one another can facilitate efficient vapor flow and liquid flow through the microcondenser device 50. As used herein, relative positioning can refer to positioning of a central axis or central area of each of the inlet 54 and outlets 56, 62 relative to one another. In particular, as shown, the vapor outlet 62 can be relatively positioned vertically above the vapor inlet 54 and above the condensation outlet 56. The condensation outlet 56 can be relatively positioned below the vapor inlet 54 and below the vapor outlet 62. The vapor inlet 54 can be disposed vertically between the vapor outlet 62 and the condensation outlet 56. In addition to relative positioning, relative sizing can facilitate efficient fuel flow through the microcondenser device 50. For example, as shown, the vapor inlet 54 can have an increased size relative to the condensation outlet 56, which itself can have an increased size relative to the vapor outlet 62.

With reference to FIGS. 11 and 12, the microcondenser device 50 can additionally include a heat removal assembly 180 or 182 that is in thermal contact with a hot side 66*b* of the thermoelectric element 66. The heat removal assembly 180 or 182 can comprise at least one of heat pipe 180 (FIG. 11) or a liquid cooling circuit 182 (FIG. 12). In FIG. 11, an exemplary heat pipe 180 is shown having a casing 184, a wick 186 and a vapor cavity 188. As is known and understood by those skilled in the art, the heat pipe 180 can facilitate more rapid removal of heat from the hot side 66*b* of the thermoelectric element 66, which reduces the power consumption of the thermoelectric element 66 for condensing fuel vapor in the chamber 80. In FIG. 12, an exemplary liquid cooling circuit 182 is shown having a pump 190, a heat exchanger 192 and a liquid circulation loop 194. As is known and understood by those skilled in the art, the pump 190 circulates a heat transfer fluid (e.g., antifreeze) in the loop 194 from the hot side 66*b* of the thermoelectric element 66 where the fluid absorbs heat from the thermoelectric element 66 to the heat exchanger 192 where the fluid dissipates its absorbed heat. Alternatively or in addition, the hot side 66*a* of the thermoelectric element 66 can be cooled by convection fins and/or a fan (both not shown). Although not shown, a thermal paste can be used between the heat removal assembly 180 or 182 and the hot side 66*a* of the thermoelectric element 66. Using the heat pipe 180 or the liquid cooling circuit 182, rapid heat removal can occur from the hot side 66*a* of the thermoelectric element 66 increasing its efficiency.

Figure 13:
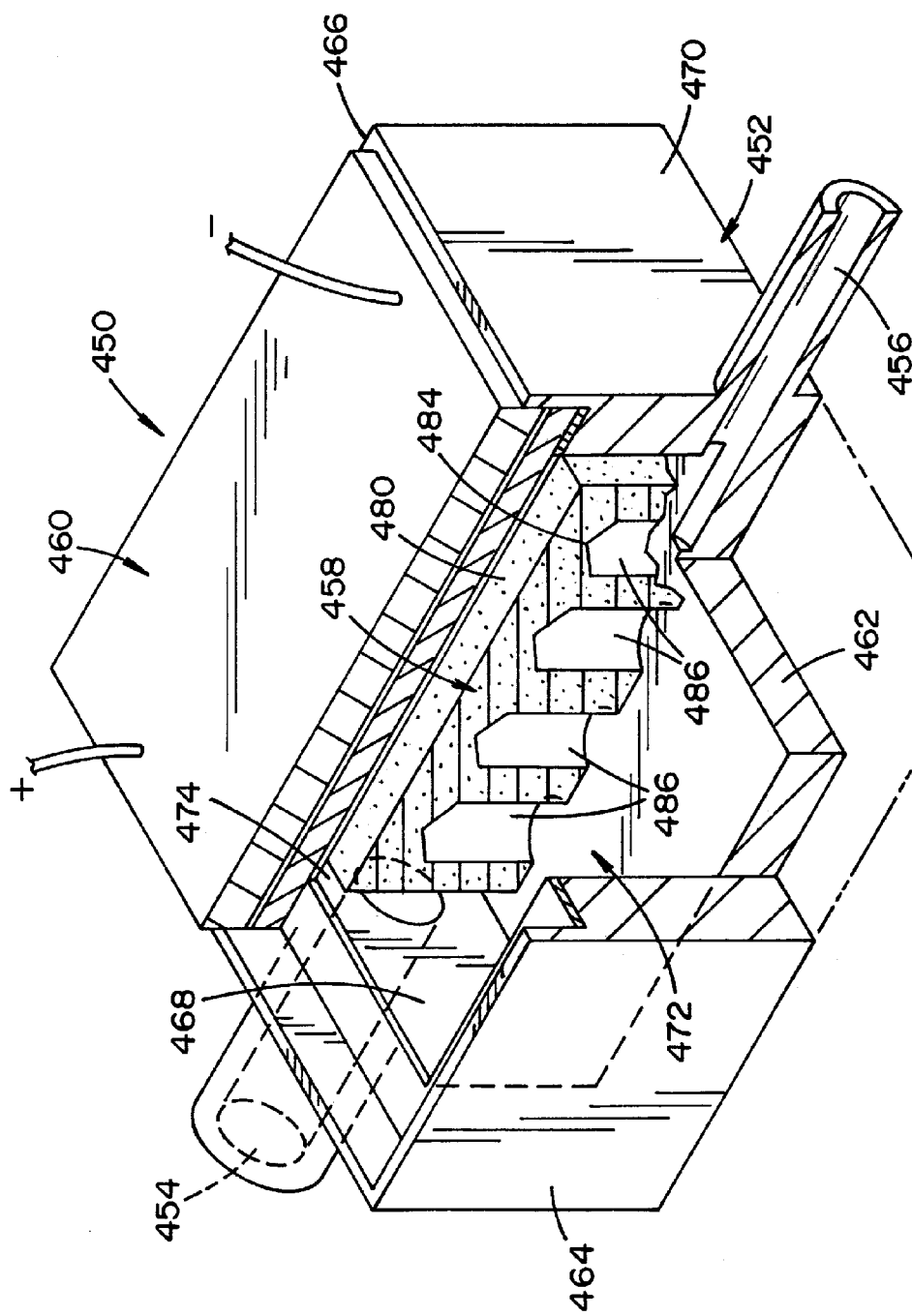
FIG. 13 is a perspective view, partially in cross-section, of a microcondenser device according to still another alternate embodiment.
Figure 14:
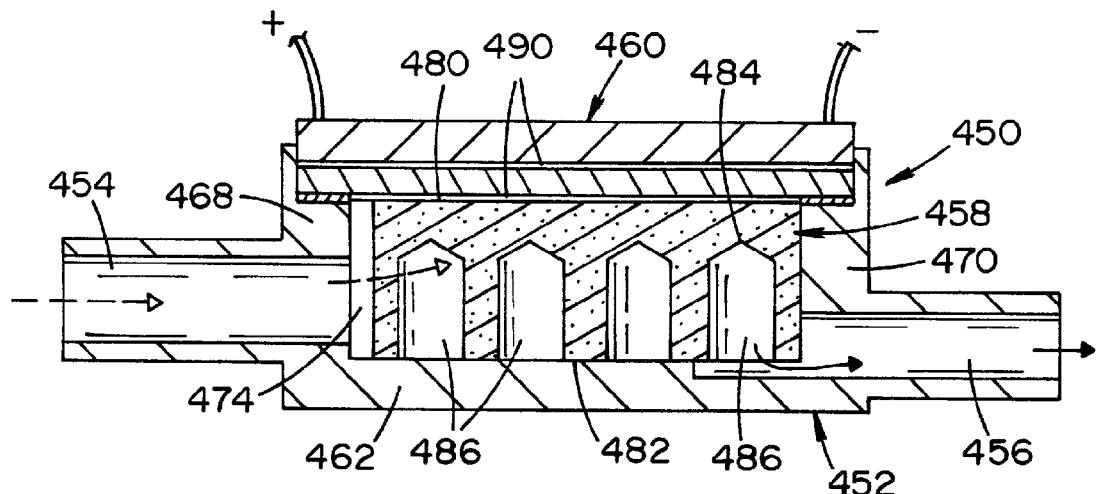
FIG. 14 is an elevational cross-section view of the microcondenser device of FIG. 13.
Figure 15:
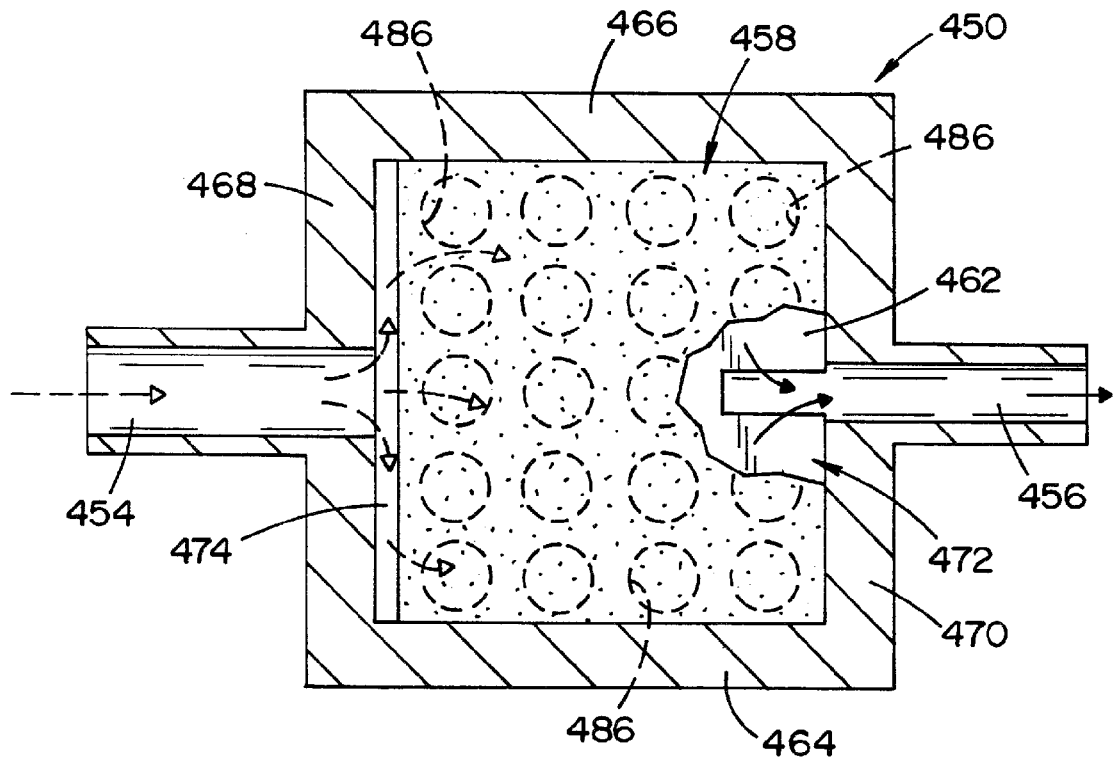
FIG. 15 is a plan cross-section view of the microcondenser device of FIG. 13.

With reference to FIGS. 13, 14 and 15, a microcondenser device 450 is illustrated according to a further alternate embodiment. The microcondenser device 450 can be the same or similar as the microcondenser devices 50, 150, 250 and 350 already described herein except as indicated below. As with the already described microcondenser devices, the device 450 can include a housing 452 having an inlet 454 for receiving fuel vapor and a condensation outlet 456 for discharging condensed fuel vapor. The device 450 also includes a porous element 458 disposed in the housing 452 and fluidly interposed between the inlet 454 and the condensation outlet 456 for absorbing the fuel vapor received through the inlet 454. Additionally, the device 450 includes a thermoelectric element 460 in thermal contact with the porous element 458 for removing heat from the fuel vapor absorbed by the porous element 458 to condense the fuel vapor.

Also like the already described microcondenser devices, the housing 452 of the microcondenser device 450 can have a lower wall 462 and at least one side wall 464, 466, 468, 470 extending upward from the lower wall 462. The lower wall 462 and the at least one side wall 464-470 together define a chamber 472 in the housing 452. As shown, the thermoelectric element 460 can be supported by the at least one side wall 464-470 in spaced relation relative to the lower wall 462 and the porous element 458 can be received in the chamber 472. In the illustrated embodiment, the porous element 458 is shown as being a single piece or unit. It should be appreciated, however, that the porous element 458 could alternatively be comprised of a plurality of porous elements positioned adjacent one another (e.g., two or more piece construction).

As with the earlier described microcondenser devices, the inlet 454 can be defined through the at least one wall 464-470, and particularly through the side wall 468, so as to be in fluid communication with the chamber 472 and also with a plenum chamber portion 474 of the chamber 472. More particularly, the plenum chamber portion 474 is defined within the chamber 472 of the housing 452 between the inlet 454 and the porous element 458. As shown in the illustrated embodiment, the plenum chamber portion 474 can extend along substantially an entire lateral width of the porous element 458 (i.e., from side wall 464 to side wall 466 and along side wall 468). In particular, the porous element 458 can be laterally spaced apart from the at least one wall 464-470, and particularly from the side wall 468, so as to define the plenum chamber 474 interposed between the inlet 454 and the porous element 458.

The porous element 458 and porous element 100 can be formed of a porous or microporous metal or metal alloy or of a carbon foam. Illustrative examples of metal and metal alloys include, but are not limited to, aluminum, nickel, copper, iron, magnesium, and mixtures thereof. Any of these porous materials can be a co-continuous material comprised of open cells enabling fuel vapor and condensed fuel vapor to more easily pass through the porous element 458 or porous element 100 (i.e., voids in the foam are interconnected). In the illustrated embodiment, the porous element 458 is formed of the microporous aluminum foam. Microporous aluminum foam for the porous element 458 has been found to have advantageous attributes, including that it is less brittle and therefore more easily applied with pressure against the thermoelectric element 460 for improved heat transfer between the porous element 458 and the thermoelectric element 460. In addition, microporous aluminum foam has been found to exhibit better heat transfer characteristics generally.

In one embodiment, the use of microporous aluminum foam for the porous element 458 (or porous element 100) enables the baffles, particularly baffles formed of a spongy material, to be excluded from the microcondenser device, including the baffles described in association with the microcondenser devices 50, 150, 250 and 350. Additionally, with the exception of the optional plenum chamber 474, the various other chamber portions described in association with the microcondenser devices 50, 150, 250 and 350 can be excluded from the microcondenser device 450. Still further, the less brittle nature of the microporous aluminum foam allows for maximum contact between a porous element 458 and the thermoelectric element 460 and/or the housing 452. That is, the less brittle nature of the microporous aluminum foam enables the same to be pressed tightly against the thermoelectric element 460 (or other elements interposed and thermally connected to the thermoelectric element 460) with a reduced risk of breakage of the porous element 458.

As already described herein in association with the microcondenser devices 50, 150, 250, 350, the housing 452 of the microcondenser device 450 can be formed of plastic. Alternatively, the housing 452 is formed of aluminum, which facilitates higher heat transfer from the fuel vapor to the thermoelectric element 460. More particularly, in some instances, employing a plastic body in a microcondenser device can cause warm zones around a perimeter of the porous element, particularly when the porous element is a foam element (e.g., a carbon foam element). This can potentially result in fuel vapor (e.g., butane vapor) remaining along a perimeter or peripheral sides of the porous element and potentially migrating through the plastic body and leaking from the microcondenser device. This potentially can cause a plastic body to warp due to the large thermo stress placed thereon from the passing fuel vapor. Ultimately, this can result in reduced or no condensation of the fuel vapor passed to the microcondenser device. Use of an aluminum body for the housing 452, or any of the housings of the microcondenser devices 50, 150, 250, 350, can allow for higher heat transfer from the porous element 458 and/or no or reduced warpage of the housing.

In the illustrated embodiment, the porous element 458 includes a first surface 480 disposed adjacent the thermoelectric element 460 and a second, opposite surface 482 having at least one chamber or aperture defined therein for reducing a thermal gradient across the porous element 458. In one embodiment, the at least one aperture extends from the second, opposite surface 482 to a location (e.g., location 484) adjacent and spaced apart from the first surface 480, though this is not required and other arrangements for the at least one chamber or aperture are contemplated. In the illustrated embodiment, the at least one aperture is a plurality of apertures 486 dispersed about the second surface 482 of the porous element 458. Each of the plurality of apertures 486 extends from the second, opposite surface 482 to a location (e.g., 484) adjacent and spaced apart from the first surface 480. Although described herein as extending to the second surface 482, it is to be understood that the at least one aperture may be entirely enclosed within the porous element 458. In yet another non-limiting example, at least one aperture may be provided that is entirely enclosed within the porous element 458, and at least one aperture may be provided that extends from the second surface 482 to the location 484 adjacent and spaced apart from the first surface 480 or that extends from the first surface 480 to the second surface 482.

In the illustrated embodiment, each of the plurality of apertures 486 is cylindrical shaped, though this is not required. Also in the illustrated embodiment, each of the plurality of apertures 486 can extend approximately 6 mm into the porous element 458 from the second, opposite surface 482 and can be spaced apart from the first surface 480 by approximately 2 mm (i.e., a closed-end of each of the plurality of apertures 486, e.g., at location 484, is spaced apart from the first surface 480 2 mm), though this too is not required. Further, as shown in the illustrated embodiment, the porous element 458 can be hexahedron shaped with the upper surface 480 forming an upper side and lower surface 42 forming a lower side.

Corresponding to the hexahedron shape, the plurality of apertures 486 can be arranged in rows and columns on the lower side 482 with at least two rows and at least two columns. More particularly, as shown in the illustrated embodiment, the apertures 486 can be arranged in four columns extending away from the inlet 454 (i.e., between the side walls 468 and 470) and five rows extending toward the outlet 456 (i.e., between the side walls 464 and 466). Additionally, and as further shown with respect to the illustrated embodiment, space in between the plurality of apertures 486 can be approximately equal, such as along each row and along each column. While the arrangement of the apertures 486 has been described with some specificity in regard to the illustrated embodiment, it will be appreciated by those skilled in the art that other arrangements can be employed and may deviate from what is shown in the illustrated embodiment.

As described in reference to the microcondenser device 50, a heat conductive plate 490 (e.g., a copper plate) can be interposed between the porous element 458 and the thermoelectric element 460, though this is not required. Alternatively, the porous element 458 can be positioned directly adjacent the thermoelectric element 460 without a heat conductive plate 490 interposed therebetween. With or without the heat conductive plate 490, a thermal paste 492 can be interposed between the porous element 458 and the thermoelectric element 460. When the heat conductive plate 490 is included, the thermal paste 492 can be interposed between the copper plate 490 and the thermoelectric element 460 and also between the copper plate 490 and the porous element 458. Optionally, a seal 494 can be interposed between an underside of the copper plate 490 and the thermoelectric element 460 within a recess defined in the housing 452, similar or the same as seal 108 is interposed between the underside of copper plate 102 and shoulder 84 in the microcondenser device 50. If no copper plate 490 is included, the seal 494 can still optionally be used, but would be interposed directly between a shoulder defined by the housing 452 and the thermoelectric element 460. Also like the microcondenser device 50, the microcondenser device 450, and particularly the housing 452 thereof, can include an insulating layer disposed there around, though this is not illustrated.

Though not illustrated, it is to be appreciated by those skilled in the art that the porous element 458 of the microcondenser device 450 can have a varying porosity, such as described in association with the microcondenser device 50. For example, the varying porosity could include an increased porosity adjacent the inlet 454 relative to a porosity adjacent the condensation outlet 456. Alternatively or in addition, the porous element 458 could have an increased porosity adjacent an underside thereof (i.e., second, opposite surface 42), which is disposed adjacent the condensation outlet 456, than an upper side (i.e., first surface 480) adjacent the thermoelectric element 460. Other optional variations that could be employed in association with the microcondenser device 450 include the use of a heat pipe or a liquid cooling circuit for removing heat from the thermoelectric element 460. For example, the heat pipe 170 of FIG. 11 or the liquid cooling circuit 172 of FIG. 12 could be employed for removing heat from the thermoelectric element 460.

Still further, the housing 452 of the microcondenser device 450 can optionally include a vapor outlet such as the vapor outlet 62 described in reference to the microcondenser device 50 for discharging fuel vapor that remains vaporized after passing through the porous element 458, though this is not illustrated in connection with the microcondenser device 450. With a vapor outlet on the housing 452, the porous element 458 could be fluidly interposed between the inlet 454 and such a vapor outlet. As with the vapor outlet 62, a vapor outlet on the housing 452 could be elevated relative to the inlet 454 and, as shown in the illustrated embodiment, the inlet 454 can be elevated relative to the condensation outlet 456. If the porous element 458 includes a varying porosity and a vapor outlet is provided in the housing 452, the porous element 458 could have an increased porosity adjacent a first side of the porous element 458 disposed adjacent the inlet 454 than a second side adjacent a vapor outlet defined in the housing 452. This could be coupled with an increased porosity adjacent an underside of the porous element 458 disposed adjacent the condensation outlet 458 as compared to adjacent the thermoelectric element 460.

As with the microcondenser devices 50, 150, 250, 350, the microcondenser device 450 and any of the various embodiments or configurations described herein can be mounted on a vehicle with the inlet 454 fluidly connected to a fuel tank without a canister interposed between the fuel tank and the inlet 454, and the outlet 456 can be fluidly connected to the fuel tank for returning condensed fuel vapor back to the fuel tank. For example, the microcondenser device 450 could be substituted for the microcondenser device 50 in the system 10 depicted in FIG. 1. Accordingly, the inlet 454 could be connected to the fuel tank 26 via line 58 and the outlet 456 could also be connected, such as via line 60 to the fuel tank 25. If a vapor outlet is included on the microcondenser device 450, such a vapor outlet could be connected to engine intake 14 via line 64.

Figure 16:
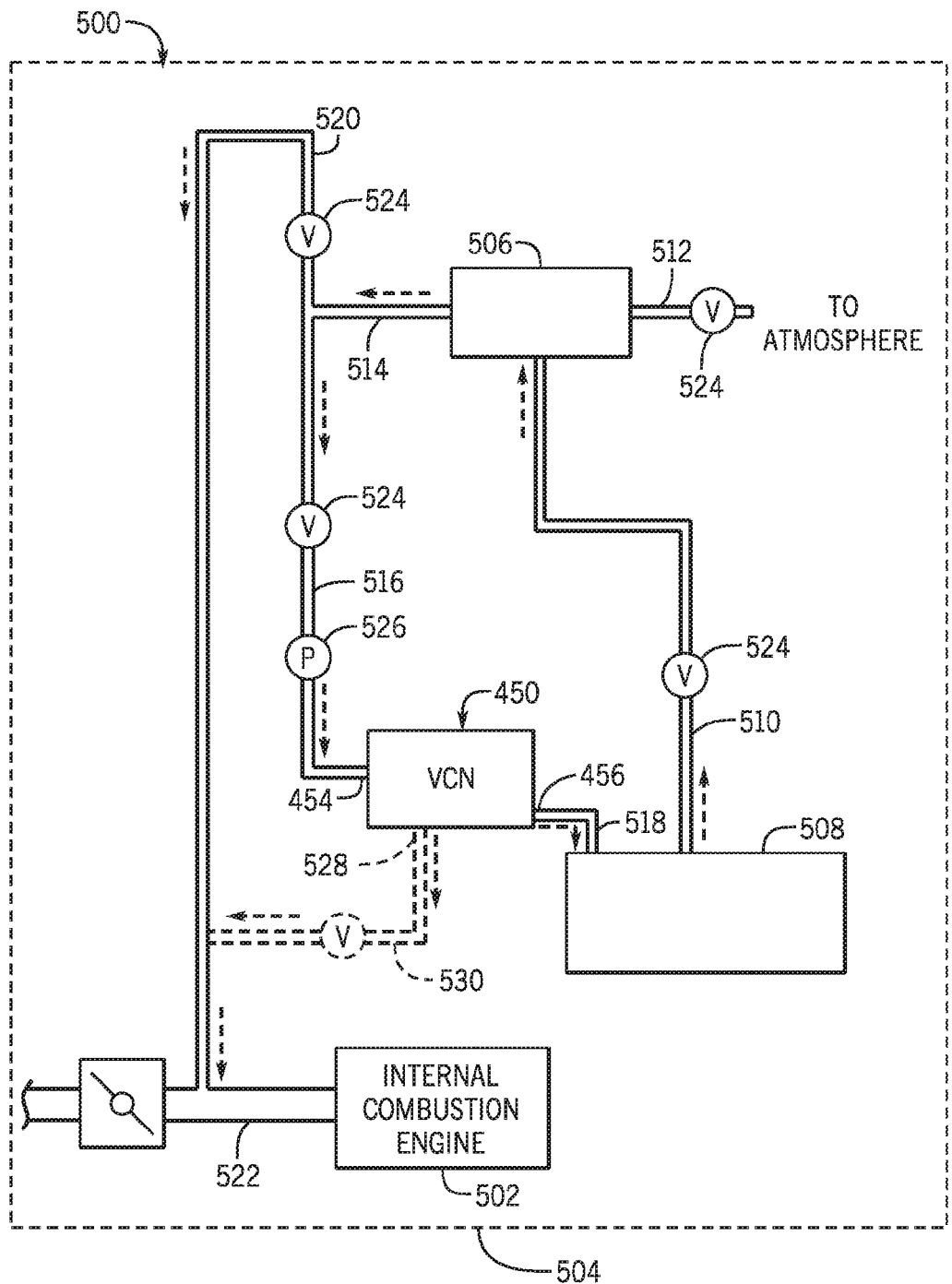
FIG. 16 is a schematic view of an evaporative emission control system having a microcondenser device for processing fuel vapor from a canister.

In a non-limiting example, with reference to FIG. 16, the microcondenser device 450 can be used within an evaporative emission control system 500 including an internal combustion engine 502 on a vehicle 504. In the system 500, the housing 452 of the microcondenser device 450 is mounted on the vehicle 504 with the inlet 454 fluidly connected to a fuel canister 506 and the condensation outlet 456 fluidly connected to a fuel tank 508. As is known and understood by those skilled in the art, the canister 506 can be fluidly connected to the fuel tank 508 in a known manner such that a charge line 510 delivers fuel vapor from the fuel tank 508 to the canister 506 for temporary retainment (e.g., in a carbon bed disposed within the canister 506). The canister 506 can be connected to atmosphere by the drain line 512 which allows air from atmosphere to enter the canister 506, such as during a purge operation. The canister 506 can further include a purge line 514 that allows for fuel vapor temporarily retained by the canister 506 to be purged therefrom as will be described in further detail below.

In the illustrated embodiment, the purge line 514 includes at least a branch line 516 fluidly connecting the canister 506 to the inlet 454 of the microcondenser device 450. This allows for fuel vapor to be purged from the canister 506 and directed to the microcondenser device 450. This fuel vapor can be processed by the microcondenser device 450 and the condensed fuel returned to the fuel tank 508 via the outlet 456 and return line 518. More particularly, the return line 518 can return a mixture of condensed fuel vapor and uncondensed fuel vapor back to the fuel tank 508. A separate branch line 520 can optionally be included. When included, line 520 fluidly connects the purge line 514 to an engine intake 522 of the internal combustion engine 502.

Suitable solenoid valves or similar flow control mechanisms 524 can be provided within the system 500 for controlling desired flow within the system as will be understood and appreciated by those skilled in the art upon reading the present disclosure. For example, the solenoid valves 524 can be controlled for allowing the canister 506 to temporarily retain fuel vapor from the fuel tank 508. The solenoid valves 524 can be further controlled to allow the canister 506 to be purged, including purging through the branch line 516 to the microcondenser device 450. When configured with the branch line 516, the solenoid valves 524 can also be operated to purge fuel vapor from the canister 506 to the engine intake 522, such as when the engine 502 is running.

Figure 16A:
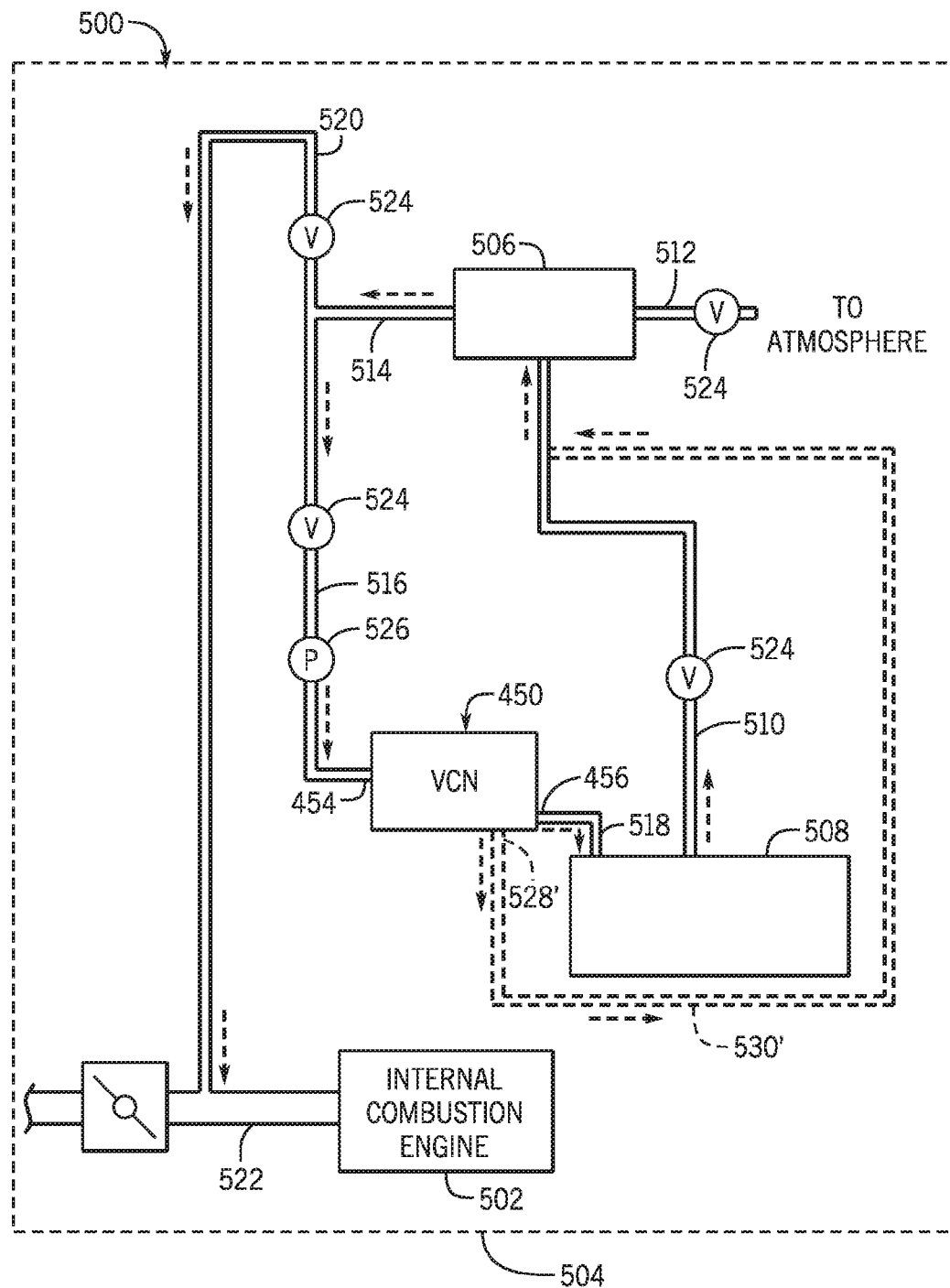
FIG. 16A is a schematic view similar to FIG. 16 but showing a modified evaporative emission control system.

To facilitate fuel vapor being directed from a canister 506 to the microcondenser device 450 via the purge line 514 and branch line 516, a pump 526 can be fluidly interposed between the fuel canister 506 and the inlet 454 of the microcondenser device 450 for forcing or pumping fuel vapor to be purged from the canister 506 into the microcondenser device 450. As shown, the pump 526 can be disposed along the branch line 516. Optionally, a vapor outlet 528 and vapor line 530 can be provided on the microcondenser device 450 where uncondensed fuel vapor is directed from the microcondenser device 450 to the engine intake 522. Alternatively, with reference to FIG. 16A, vapor outlet 528' can be provided on the microcondenser device 450 for directing uncondensed fuel vapor from the microcondenser device 450 back to the canister 506 via vapor line 530'.

Figure 17:
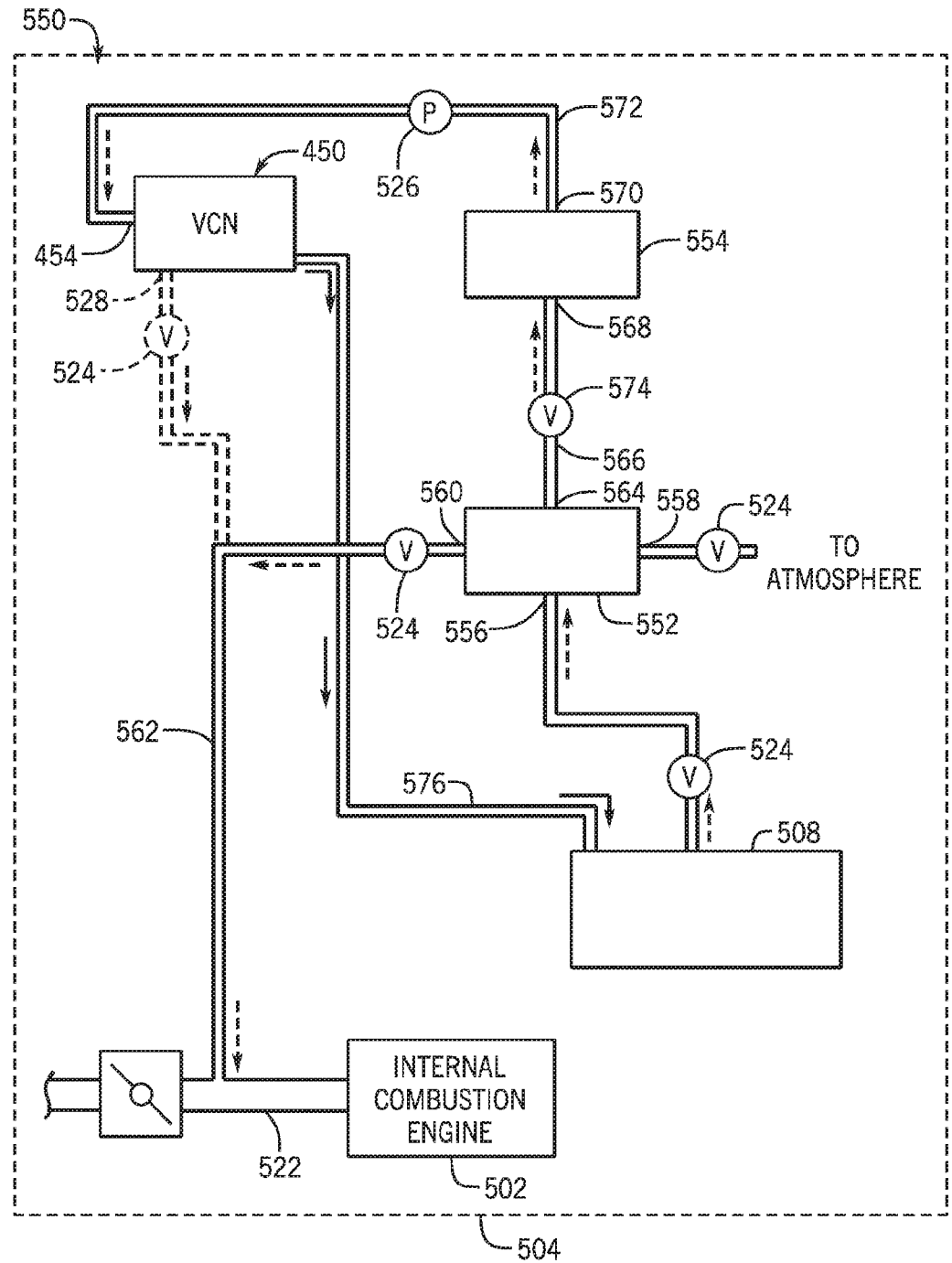
FIG. 17 is a schematic view of an evaporative emission control system having a microcondenser device for processing fuel vapor from a canister, the canister including a first canister portion and a second canister portion.

In a non-limiting example shown in FIG. 17, the microcondenser device 450 can be used with a fuel canister comprising a first canister portion 552 and a second canister portion 554. In the system 550, like reference numerals from the system 500 are used to identify like components. As shown, the first canister portion 552 has a charge inlet 556 fluidly connected to the fuel tank 508, a drain outlet 558 fluidly connected to atmosphere, a first purge outlet 560 fluidly connected via line 562 to the intake 522 of the engine 502 and a second purge outlet 564 fluidly connected via line 566 to the second canister portion 554. The second canister portion 554 has a charge inlet 568 fluidly connected to the second purge outlet 564 of the first canister portion 552 and a purge outlet 570 fluidly connected via line 572 to the inlet 454 of the microcondenser device 450, optionally with pump 526 fluidly interposed between the canister portion 554 and the microcondenser device 450.

In addition to the solenoid valves 524, a solenoid valve 574 can be fluidly interposed between the first canister portion 552 and the second canister portion 554 along the line 566. In operation, the solenoid valves 524, 574 can allow the canister portions 552, 554 to operate in a generally conventional manner. For example, fuel vapor can pass form the fuel tank 508 to the first canister portion 552 and the solenoid valve 574 can allow the second canister portion 554 to receive fuel vapor (e.g., overflow vapor) from the first canister portion 552. However, the solenoid valve 574 can also be used isolate the second canister portion 554 from the first canister portion 552. This can advantageously allow the microcondenser device 450 to process fuel vapor from the second canister portion 554 and return the processed fuel vapor to the fuel tank 508 via return line 576 without creating an undesirable pressurization situation in the fuel tank 508.

More particularly, the fuel vapor processed by the microcondenser device 450 can include condensed fuel vapor and uncondensed fuel vapor. The uncondensed fuel vapor returning to the fuel tank 508 can cause a pressure condition in the fuel tank where fuel vapor in the fuel tank needs to escape. Isolating the canister portions 552, 554 from one another allows the first canister portion 552 to process such fuel vapors from the fuel tank 508 while the microcondenser device 450 processes fuel vapor from the second canister portion 554.

Figure 17A:
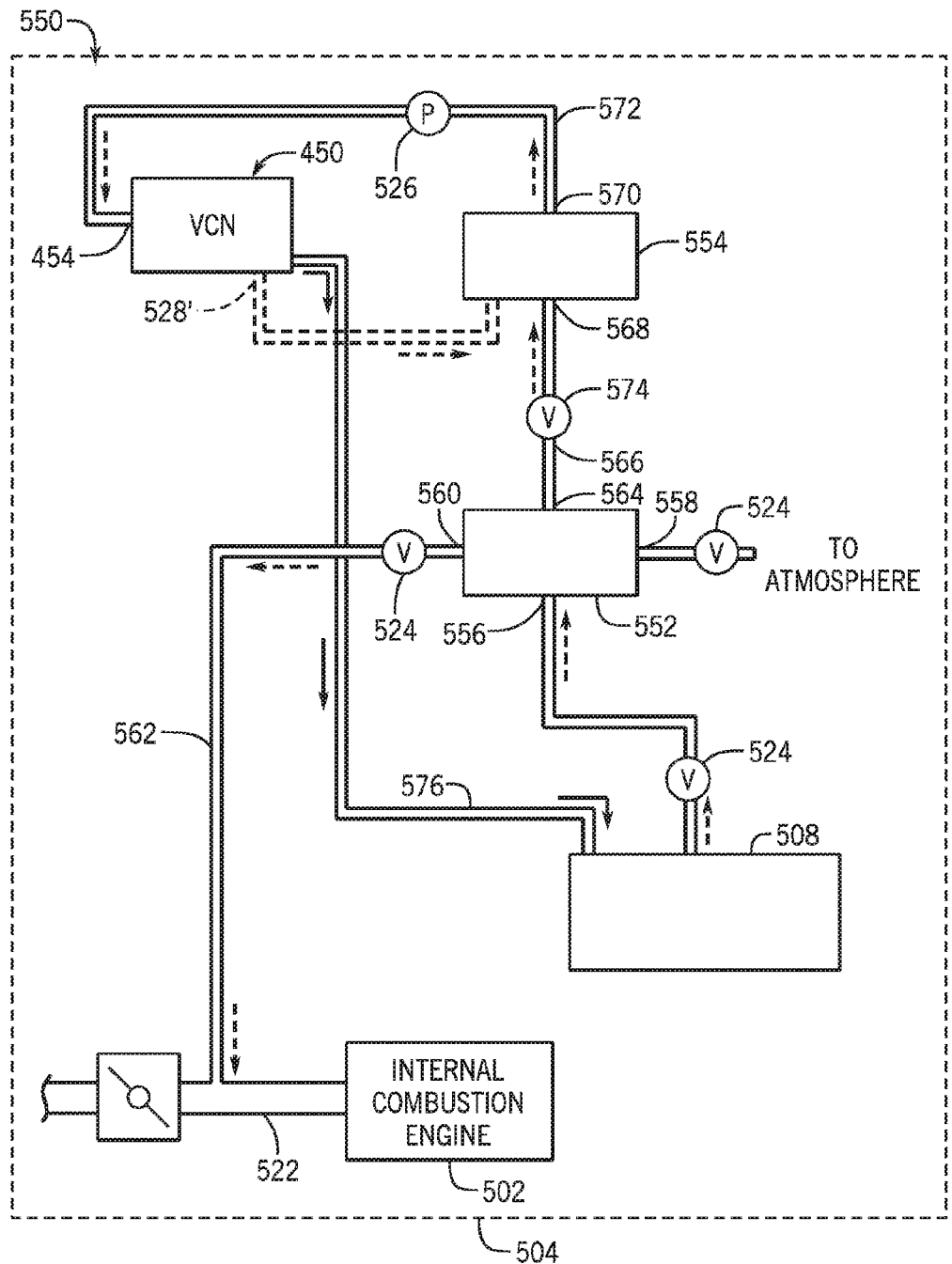
FIG. 17A is a schematic view similar to FIG. 17 but showing a modified evaporative emission control system.

Optionally, vapor outlet 528 (FIG. 17) or vapor outlet 528' (FIG. 17A) can be used in association with the microcondenser device 450 in the evaporative emission control system 550. As shown, the vapor outlet 528' can direct uncondensed fuel vapor from the microcondenser device 450 to the second canister portion 554.

Figure 18:
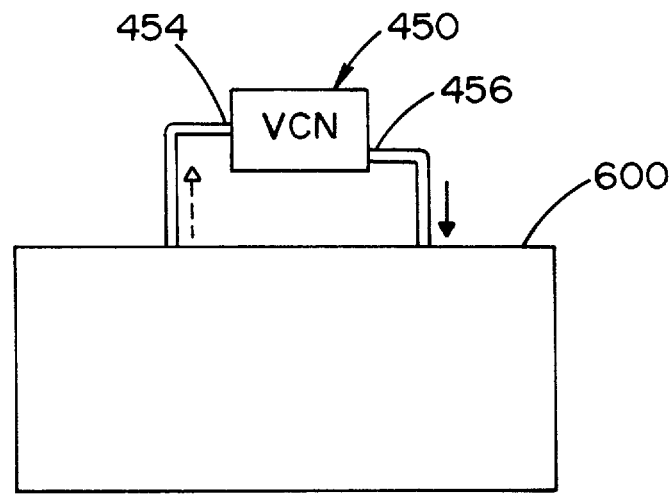
FIG. 18 is a schematic view of an evaporative emission control system having a microcondenser device for processing fuel vapor from an underground fuel storage vessel.

With reference to FIG. 18, the microcondenser device 450 is illustrated within an evaporative emission control system including an underground fuel storage vessel 600. In the illustrated arrangement, the inlet 454 can be fluidly connected to the underground fuel storage vessel 600 for directing fuel vapor from the vessel 600 to the microcondenser device 450 and the outlet 456 can be fluidly connected to the vessel 600 for returning condensed fuel vapor to the vessel 600. The use of the microcondenser device 450 for the underground fuel storage vessel 600 reduces the cost and complexity of the evaporative emission control system for the underground vessel 600.

Figure 19:
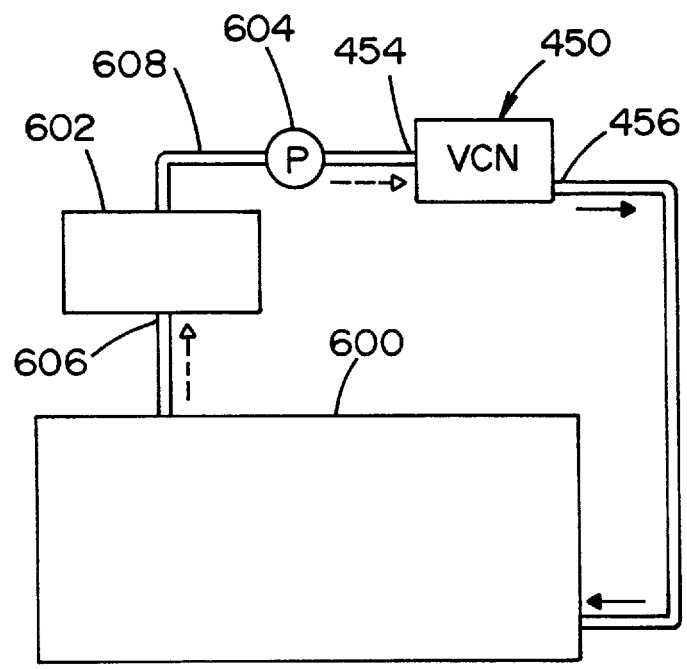
FIG. 19 is a schematic view of an evaporative emission control system having a microcondenser device for processing fuel vapor from a canister connected to an underground fuel storage vessel.

With reference to FIG. 19, the microcondenser device 450 is shown deployed in another evaporative emission control system. This system includes underground storage vessel 600, a fuel canister 602 and a pump 604. In this arrangement, the microcondenser device 450 can operate in association with canister 602 for processing fuel vapor from the underground storage vessel 600. Operation can occur in the same manner as described in reference to the vehicle evaporative emission control system 500 of FIG. 16, but of course there is no engine intake 522 or engine 502. In this respect, the fuel tank 508 in FIG. 16 can be considered a fuel storage vessel wherein vaporized fuel is generated and the microcondenser device 450 in FIG. 16 processes the vaporized fuel received from this fuel storage vessel (i.e., fuel tank 508).

Returning to FIG. 19, the canister 602 is fluidly interposed between the fuel storage vessel 600 and the microcondenser device 450. The canister 602 has an inlet 606 for receiving vaporized fuel from the fuel storage device (i.e., vessel 600) and a bed element for temporarily retaining the fuel vapor therein. The canister 602 has a purge line 608 fluidly connected to the inlet 454 of the microcondenser device 450 for directing the temporarily retained fuel vapor to the microcondenser device 450 for processing as already described herein.

In one embodiment, an evaporative emission control system is provided including a fuel storage vessel wherein vaporized fuel is generated and the microcondenser device 450 for processing the vaporized fuel received from the fuel storage vessel. As already described herein, the microcondenser device 450 can include a porous portion that facilitates removal of heat from the vaporized fuel (i.e., carbon foam or microporous aluminum foam). In this system, a canister (e.g., canister 506 or 602) can optionally be fluidly interposed between the fuel storage vessel and the microcondenser device 450. The canister can have an inlet for receiving the vaporized fuel from the fuel storage device and a bed element for temporarily retaining the fuel vapor therein. The canister can further have a purge line fluidly connected to the inlet 454 of the microcondenser device 450 for directing the temporarily retained fuel vapor to the microcondenser device 450. The purge line of the canister can be selectively fluidly connected to the inlet 454 of the microcondenser device 450. In one exemplary embodiment, the fuel storage vessel is a vehicle fuel tank and thus the purge line from the canister is selectively fluidly connected to the inlet 454 of the microcondenser device. Alternatively, the fuel storage vessel can be an underground fuel storage vessel. In either case, a pump can be fluidly interposed between the canister and the microcondenser device for moving fuel vapor from the canister to the microcondenser device.

An evaporative emission control method will now be described for the microcondenser device 450, but the method could be suitably employed in conjunction with one of the other microcondenser devices described herein. In the method, fuel vapor from a fuel storage vessel (e.g., a fuel tank on a vehicle or an underground fuel storage vessel) is directed to a microcondenser device, such as microcondenser device 450. The fuel vapor from the fuel storage vessel is condensed in the microcondenser device 450. The condensed fuel vapor is returned from the microcondenser device 450 to the fuel storage vessel. Prior to the fuel vapor being condensed by the microcondenser device 450, the fuel vapor can be temporarily retained in a fuel canister having a bed element. The fuel vapor can be selectively directed from the fuel canister to an engine intake of an internal combustion engine when the engine is running, though this is not required.

It will be appreciated that various of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A microcondenser device for an evaporative emission control system, comprising:
   a housing having an inlet for receiving fuel vapor and a condensation outlet for discharging condensed fuel vapor;
   a porous element disposed in the housing and fluidly interposed between the inlet and the condensation outlet for absorbing the fuel vapor received through the inlet: and
   a thermoelectric element in thermal contact with the porous element for removing heat from the fuel vapor absorbed by the porous element to condense the fuel vapor;
   wherein the housing has a lower wall and at least one side wall extending upward from the lower wall, the lower wall and the at least one side wall together define a chamber in the housing, the porous element supported by the at least one side wall in spaced relation relative to the lower wall, the porous element received in the chamber, and
   wherein at least one support baffle supports the porous element within the housing, wherein the at least one supported baffle includes a first baffle and separate second baffle, the first and second baffles defining a condensation chamber located between the condensation outlet and the porous element.

2. The microcondenser device of claim 1 wherein the porous element is a porous metal, a porous metal alloy, or a carbon foam.

3. The microcondenser device of claim 2 wherein the porous element is a microporous aluminum foam.

4. The microcondenser device of claim 2 wherein the porous element has a varying porosity including an increased porosity adjacent the inlet relative to a porosity adjacent the condensation outlet.

5. The microcondenser device of claim 1 wherein the housing is formed of aluminum which facilitates higher heat transfer from the fuel vapor to the thermoelectric element.

6. The microcondenser device of claim 1 wherein the porous element includes at least one chamber therein.

7. The microcondenser device of claim 6 wherein the porous element is provided with a first side and a second side opposite the first side, the second opposite side having an opening to the at least one chamber.

8. The microcondenser device of claim 7 wherein the first side is positioned adjacent the thermoelectric element.

9. The microcondenser device of claim 1 wherein the porous element includes a first surface disposed adjacent the thermoelectric element and a second, opposite surface having at least one aperture defined therein for reducing a thermal gradient across the porous element.

10. The microcondenser device of claim 1 wherein an insulating layer is disposed one of: around an exterior of the housing or inside the housing around the porous element.

11. The microcondenser device of claim 1 wherein the housing is mounted on a vehicle with the inlet fluidly connected to a fuel tank without a canister interposed between the fuel tank and the inlet, and the outlet is fluidly connected to the fuel tank.

12. The microcondenser device of claim 1 wherein the housing is mounted on a vehicle with the inlet fluidly connected to a fuel canister and the condensation outlet fluidly connected to a fuel tank.

13. The microcondenser device of claim 12 wherein a pump is fluidly interposed between the fuel canister and the inlet for forcing fuel vapor to be purged from the canister into the microcondenser device.

14. The microcondenser device of claim 13 wherein the fuel canister includes a first canister portion and a second canister portion, the first canister portion having a charge inlet fluidly connected to the fuel tank, a drain outlet fluidly connected to atmosphere, a first purge outlet fluidly connected to an intake of an internal combustion engine and a second purge outlet fluidly connected to the second canister portion, the second canister portion having a charge inlet fluidly connected to the second purge outlet of the first canister portion and a purge outlet fluidly connected to the inlet of the microcondenser device.

15. The microcondenser device of claim 1 wherein the inlet is fluidly connected to an underground fuel storage vessel for directing fuel vapor from the vessel to the microcondenser device and the outlet is fluidly connected to the vessel for returning condensed fuel vapor to the vessel.

16. The microcondenser device of claim 10 wherein the insulating layer is disposed inside the housing around the porous element.

17. A microcondenser device for an evaporative emission control system, comprising:
- a housing having an inlet for receiving fuel vapor and a condensation outlet for discharging condensed fuel vapor;
- a porous element disposed in the housing and fluidly interposed between the inlet and the condensation outlet for absorbing the fuel vapor received through the inlet; and
- a thermoelectric element in thermal contact with the porous element for removing heat from the fuel vapor absorbed by the porous element to condense the fuel vapor,
- wherein the porous element includes a first surface disposed adjacent the thermoelectric element and a second, opposite surface having at least one aperture defined therein for reducin a thermal adient across the orous element, and
- wherein the at least one aperture extends from the second, opposite surface to a location adjacent and spaced apart from the first surface, and further wherein the at least one aperture is a plurality of apertures dispersed about the second surface of the porous element.

18. The microcondenser device of claim 17 wherein the porous element is formed of microporous aluminum foam and the housing is formed of aluminum.

19. The microcondenser device of claim 17 wherein the porous element is hexahedron shaped with the upper surface forming an upper side and the lower surface forming a lower side, the plurality of apertures arranged in rows and columns on the lower side with at least two rows and at least two columns, and further wherein spacing between the plurality of apertures is approximately equal along each row and along each column.

20. An evaporative emission control system, comprising:
- a fuel storage vessel wherein vaporized fuel is generated; and
- a microcondenser device for processing the vaporized fuel received from the fuel storage vessel and for an evaporative emission control system, the microcondenser device including:
  - a housing having an inlet for receiving fuel vapor and a condensation outlet for discharging condensed fuel vapor;
  - a porous portion that facilitates removal of heat from the vaporized fuel, wherein the porous portion is a porous element disposed in the housing and fluidly interposed between the inlet and the condensation outlet for absorbing the fuel vapor received through the inlet; and
  - a thermoelectric element in thermal contact with the porous element for removing heat from the fuel vapor absorbed by the porous element to condense the fuel vapor;
  - wherein the housing has a lower wall and at least one side wall extending upward from the lower wall, the lower wall and the at least one side wall together define a chamber in the housing, the porous element supported by the at least one side wall in spaced relation relative to the lower wall, the porous element received in the chamber, and
  - wherein at least one support baffle supports the element within the housing, wherein the at least one supported baffle includes a first baffle and separate second baffle, the first and second baffles defining a condensation chamber located between the condensation outlet and the porous element.

21. The system of claim 20 further including a canister fluidly interposed between the fuel storage vessel and the microcondenser device, the canister having an inlet for receiving the vaporized fuel from the fuel storage device and a bed element for temporarily retaining the fuel vapor therein, the canister having a purge line fluidly connected to an inlet of the microcondenser device for directing the temporarily retained fuel vapor to the microcondenser device.

22. The system of claim 21 wherein the purge line is selectively fluidly connected to the inlet and is selectively fluidly connected to an engine intake of an internal combustion engine on a vehicle, and further wherein the fuel storage vessel is a fuel tank on the vehicle.

23. The system of claim 21 wherein a pump is fluidly interposed between the canister and the microcondenser device for moving fuel vapor from the canister to the microcondenser device.

24. The system of claim 23 wherein the canister includes a first canister portion and a second canister portion, the first canister portion having the inlet fluidly connected to the fuel tank and a drain port selectively fluidly connected to atmosphere, the purge line including a first purge line portion selectively fluidly connecting the first canister portion to the engine intake and a second purge line portion selectively fluidly connecting the first canister portion to microcondenser device with the second canister portion disposed along the second purge line portion and fluidly interposed between the first canister portion and the second canister portion.

25. The system of claim 20 wherein the fuel storage vessel is an underground fuel storage vessel.

* * * * *